United States Patent
Hashimoto et al.

(10) Patent No.: US 7,736,822 B2
(45) Date of Patent: Jun. 15, 2010

(54) RESIST UNDERLAYER COATING FORMING COMPOSITION FOR MASK BLANK, MASK BLANK AND MASK

(75) Inventors: Masahiro Hashimoto, Shinjuku-ku (JP); Tomoyuki Enomoto, Toyama (JP); Takahiro Sakaguchi, Toyama (JP); Rikimaru Sakamoto, Toyama (JP); Masaki Nagai, Chiyoda-ku (JP)

(73) Assignees: Hoya Corporation, Tokyo (JP); Nissan Chemical Industries, Ltd., Tokyo (JP)

( * ) Notice: Subject to any disclaimer, the term of this patent is extended or adjusted under 35 U.S.C. 154(b) by 601 days.

(21) Appl. No.: 11/703,723

(22) Filed: Feb. 8, 2007

(65) Prior Publication Data

US 2007/0190459 A1 Aug. 16, 2007

(30) Foreign Application Priority Data

Feb. 13, 2006 (JP) ............................. 2006-035431

(51) Int. Cl.
*G03F 7/00* (2006.01)
*G03F 7/004* (2006.01)
*G03F 7/20* (2006.01)

(52) U.S. Cl. ................. 430/5; 430/270.1; 430/273.1; 430/275.1; 430/317; 430/318

(58) Field of Classification Search ............. 430/5, 430/270.1, 273.1, 275.1, 317, 318
See application file for complete search history.

(56) References Cited

U.S. PATENT DOCUMENTS

| | | | | |
|---|---|---|---|---|
| 5,919,599 A | * | 7/1999 | Meador et al. | 430/271.1 |
| 6,495,305 B1 | * | 12/2002 | Enomoto et al. | 430/270.1 |
| 6,605,394 B2 | * | 8/2003 | Montgomery et al. | 430/5 |
| 7,309,560 B2 | * | 12/2007 | Sakamoto et al. | 430/270.1 |

FOREIGN PATENT DOCUMENTS

| | | |
|---|---|---|
| JP | A 2003-107675 | 4/2003 |
| WO | WO 03/071357 | 8/2003 |

* cited by examiner

*Primary Examiner*—Amanda C. Walke
(74) *Attorney, Agent, or Firm*—Oliff & Berridge, PLC

(57) ABSTRACT

There is provided a resist underlayer coating forming composition used in processes for manufacturing a mask blank and a mask, and a mask blank and a mask manufactured from the composition. The resist underlayer coating forming composition comprises a polymer compound having a halogen atom-containing repeating structural unit and a solvent. In a mask blank including a thin film for forming transfer pattern and a chemically-amplified type resist coating on a substrate in that order, the composition is used for forming a resist underlayer coating between the thin film for forming transfer pattern and the resist coating. The polymer compound is preferably a compound containing a halogen atom in an amount of at least 10 mass %.

11 Claims, 4 Drawing Sheets

RESIST UNDERLAYER COATING FORMING COMPOSITION FOR MASK BLANK, MASK BLANK AND MASK

BACKGROUND OF THE INVENTION

1. Field of the Art

The present invention relates to a resist underlayer coating forming composition used for a mask blank that has a resist underlayer coating under a chemically-amplified type resist coating. Specifically, the present invention relates to a resist underlayer coating forming composition comprising a polymer compound having a halogen atom-containing repeating structural unit and a solvent. Further, the present invention relates to a mask blank in which a resist underlayer coating composed of the resist underlayer coating forming composition is formed, and a mask prepared by using the mask blank.

2. Description of the Related Art

A photomask (reticle) used in micro-processing technique of semiconductor devices is produced by patterning an opaque film formed on a transparent substrate. The patterning of the opaque film is carried out by for example etching by use of a resist pattern as a mask. The resist pattern is formed by for example electron beam lithography process and the like.

In recent years, in the mask production field, it is considered to make an accelerating voltage of electron beam used in the electron lithography process 50 eV or more. This is because it is required to lower forward scattering of electron beam passing electron beam resist and to improve beam convergence of the electron beam so that finer resist pattern would be resolved. When the accelerating voltage of electron beam is low, forward scattering occurs on the surface of the resist or in the resist, and the forward scattering deteriorates the resolving property of the resist. However, when an accelerating voltage of electron beam of 50 eV or more is applied, forward scattering is reduced inversely proportional to the accelerating voltage, and energy provided to the resist by the forward scattering is reduced, and thus the resist occur shortage of sensitivity in case where for example an electron beam resist for an accelerating voltage of 10 to 20 eV, or the like is used, and therefore fall of throughput occurs.

In case where is used a chemically-amplified type resist coating in the mask production field, it is known that for example when the vicinity of the surface of a base coating is in state of a relatively low film density or in a rough state, a problem that the chemically-amplified type resist coating is deactivated may occur. Concretely, an acid-catalyzed reaction during patterning is inhibited in the interface between an anti-reflective coating of chromium oxide that becomes a base coating and a resist coating, and thereby the resolving property is often deteriorated in the bottom part of the resist pattern. In this case, shape defects such as a shape defect in the bottom part in for example a chemically-amplified type resist coating of positive type, or a crack in negative type occur.

It is assumed that this is responsible for an apparent lowering of the sensitivity of chemically-amplified type resist coating in the interface with the base coating (deactivation of resist coating) for example by suppression (quench) of the acid generated in the resist coating by exposure to light with a base component on the chromium oxide surface, or by diffusion of the acid to the chromium oxide side.

As methods for resolving the problem of the above-mentioned shape defects, it is reported to introduce an inorganic coating of silicide materials or an organic anti-reflective coating as a base coating (anti-deactivation coating) (see, for example Patent Document 1).

On the other hand, Patent Document 2 discloses an anti-reflective coating forming composition comprising a polymer material containing halogen atom for forming an anti-reflective coating that strongly absorbs a light at wavelength 157 nm.

Patent Document 1: JP-A-2003-107675 (2003)
Patent Document 2: WO 03/071357 pamphlet

SUMMARY OF THE INVENTION

In case where an underlayer coating is formed under a resist coating like the invention disclosed in Patent Document 1, it is observed that a lowering in resolving property of patterning of the opaque film occurs due to the influence of the resist underlayer coating. For example, when a resist underlayer coating and an opaque film are etched by use of a resist pattern of a chemically-amplified type resist coating as a mask, the resist coating is also etched during the etching of the resist underlayer coating, as a result of it, a lowering in resolving property of the resist pattern is observed.

In this case, even when the resolving property of the resist pattern right after formation is high, the resolving property of the resist pattern is lowered at the time of the etching of the opaque film. In addition, the resolving property of the patterning of the opaque film that is etched by use of the resulting resist pattern as a mask is also lowered.

That is, even if the problems of the above-mentioned shape defects such as shape defect in the bottom part or crack, or the like that occur when a chemically-amplified type resist coating is used as a mask blank would be resolved, it turns out that there is a case causing a new problem that the resolving property of patterning of the opaque film cannot be fully improved due to the formation of the resist underlayer coating.

In addition, it is considered on problems that the use of a chemically-amplified type resist coating as a mask blank itself causes, and it is observed that base layer of the resist coating having some compositions does not provide a sufficient adherence between the resist coating and the base layer. For example, in case where the base coating is a silicide film, there is a case where resist pattern disappears during development due to insufficient adherence between the resist coating and the base layer Further, there is a case where it is difficult to form an even resist coating due to insufficient coating property.

Therefore, it is an object of the present invention is to provide a resist underlayer coating forming composition used for a resist underlayer coating formed under a resist coating that can resolve the above-mentioned problems caused by the use of a chemically-amplified type resist coating as a mask blank, that is, that does not occur shape defects such as a shape defect in the bottom part or crack, can fully improve the resolving property of patterning of a thin film for forming transfer pattern (replicated), and is excellent in adherence with resist coatings and other base coatings. And another object of the present invention is to provide a mask blank and a mask that does not occur shape defects such as a shape defect in the bottom part or crack, and can fully improve the resolving property of patterning of a thin film for forming transfer pattern.

The present invention relates to the following aspects:

as a first aspect, a resist underlayer coating forming composition used for a mask blank in which a thin film for forming transfer pattern, a resist underlayer coating and a chemically-amplified type resist coating are formed on a substrate in that order, comprising a polymer compound having a halogen atom-containing repeating structural unit and a solvent;

as a second aspect, the resist underlayer coating forming composition as described in the first aspect, wherein the polymer compound is a compound containing a halogen atom in an amount of at least 10 mass %;

as a third aspect, the resist underlayer coating forming composition as described in the first or second aspect, wherein the polymer compound is a compound of formula (1) wherein L is a bonding group constituting the main chain of the polymer compound, M is a direct bond, or a linking group containing at least one selected from —C(.dbd.O)—, —CH.sub.2- or —O—, Q is an organic group, at least one of L, M and Q contains a halogen atom, and V is the number of structural units contained in the polymer compound that ranges from 1 to 3000;

as a fourth aspect resist underlayer coating forming composition as described in the third aspect, wherein L is the main chain of acrylic or novolak polymer compound;

as a fifth aspect, the resist underlayer coating forming composition as described in any one of the first to fourth aspects, wherein the halogen atom is chlorine atom, bromine atom, or iodine atom;

as a sixth aspect, the resist underlayer coating forming composition as described in any one of the first to fifth aspects, further comprising a crosslinking agent and a crosslink catalyst, in addition to the polymer compound and the solvent;

as a seventh aspect, the resist underlayer coating forming composition as described in any one of the first to sixth aspects, further comprising an acid generator, in addition to the polymer compound and the solvent;

as an eighth aspect, the resist underlayer coating forming composition as described in any one of the first to seventh aspects, wherein the polymer compound has a weight average molecular weight of 700 to 1000000;

as a ninth aspect, a mask blank in which a thin film for forming transfer pattern and a resist underlayer coating are formed on a substrate in that order, characterized in that the resist underlayer coating is a resist underlayer coating formed from the resist underlayer coating forming composition as described in any one of the first to eighth aspects;

as a tenth aspect, the mask blank as described in the ninth aspect, wherein the thin film for forming transfer pattern is composed of a material containing chromium;

as an eleventh aspect, the mask blank as described in the ninth or tenth aspect, wherein the mask blank is a mask blank for dry etching treatment that is applied for a mask production process comprising patterning the thin film for forming transfer pattern by dry etching treatment of a chlorine based gas containing chlorine by use of a resist pattern from a chemically-amplified type resist formed on the resist underlayer coating as a mask;

as a twelfth aspect, the mask blank as described in any one of the ninth to eleventh aspects, wherein a chemically-amplified type resist coating is formed on the resist underlayer coating; and as a thirteenth aspect, a mask characterized by including a mask pattern formed by patterning the thin film for forming transfer pattern in the mask blank as described in any one of the ninth to twelfth aspects.

The resist underlayer coating obtained from the resist underlayer coating forming composition of the present invention does not inhibit acid catalyzed reaction during patterning, and thus can provide a good resist pattern. In addition, the resist underlayer coating has a fully high etching rate compared with a resist coated thereon, and thus the resist coating is not etched during the etching of the underlayer coating. Therefore, a thin film for forming transfer pattern can be etched while the resolving property of resist pattern right after the forming of the resist coating is kept, and thus the resolving property in patterning of the thin film for forming transfer pattern can be improved.

In addition, the underlayer coating formed by use of the resist underlayer coating forming composition according to the present invention is excellent in adherence with resist coatings or other base coatings.

The resist underlayer coating in the mask blank of the present invention dose not require any effect for preventing reflection light, contrary to any anti-reflective coating in semiconductor production process for preventing reflection light from a substrate. Therefore, the resist underlayer coating makes possible to form a clear mask pattern on exposure to light of resist by use of electron beam by forming it under a resist for mask blank.

DESCRIPTION OF THE PREFERRED EMBODIMENTS

Figure 1:
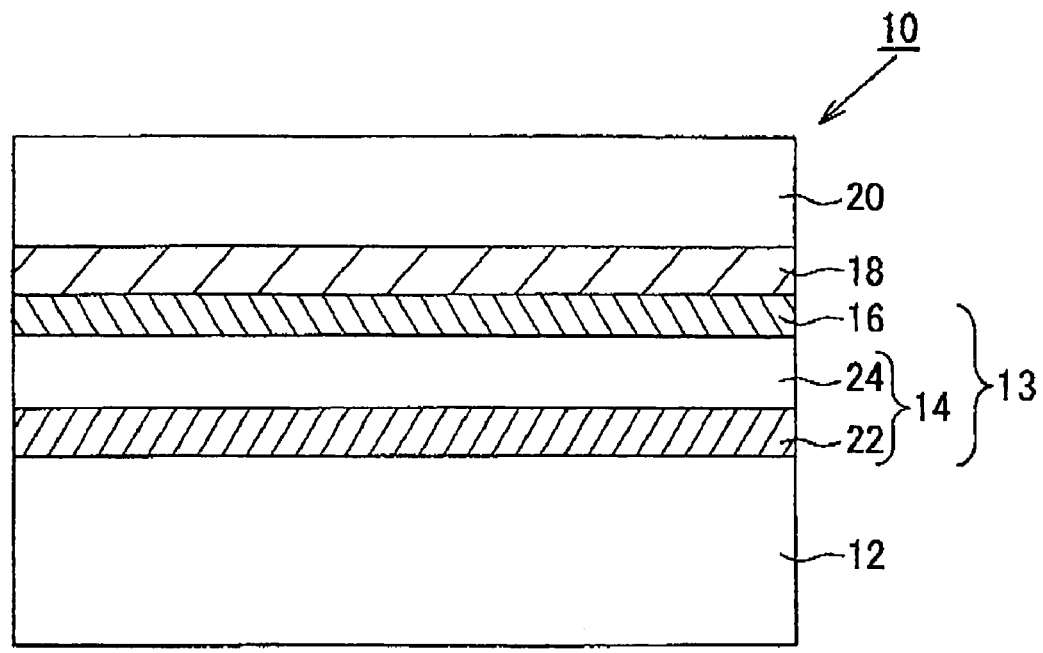
FIG. 1 is a sectional view showing a mask blank 10 according to a first embodiment for which the resist underlayer coating forming composition of the present invention is applied.

The present invention relates to a resist underlayer coating forming composition comprising a polymer compound having a halogen atom-containing repeating structural unit and a solvent, which is used for production of a mask blank in which a chemically-amplified type resist coating is formed, and which is used for forming a resist underlayer coating between a thin film for forming transfer pattern on a substrate, and the resist coating.

The resist underlayer coating forming composition of the present invention is a composition comprising a polymer compound having a halogen atom-containing repeating structural unit and a solvent, a composition comprising a polymer compound having a halogen atom- and a crosslink forming substituent-containing repeating structural unit and a solvent, or a composition comprising a polymer compound having a halogen atom-containing repeating structural unit and a crosslink forming substituent-containing repeating structural unit and a solvent, and the compositions contain crosslink catalysts, surfactants and so on as arbitrary components. The proportion of the solid content in the resist underlayer coating forming composition of the present invention is 0.1 to 50 mass %, preferably 0.5 to 30 mass %. In this specification, the solid content means all components in the resist underlayer coating forming composition from which the solvent component is excluded.

The proportion of the polymer compound of the resist underlayer coating forming composition in the solid content is 20 mass % or more, for example 20 to 100 mass %, or 30 to 100 mass %, or 50 to 90 mass %, or 60 to 80 mass %.

In addition, the polymer compound contains halogen atom in an amount of at least 10 mass %, preferably 10 to 80 mass %, more preferably 20 to 70 mass %.

The halogen atom is contained in the moiety of L corresponding to the main chain in formula (1), the moiety of M corresponding to a linking group, Q corresponding to an organic group, or the moiety comprising a combination thereof.

The halogen atom is fluorine atom, chlorine atom, bromine atom or iodine atom, particularly preferably chlorine atom, bromine atom, iodine atom or a combination thereof.

The polymer compound can contain a crosslink forming substituent. The crosslink forming substituent includes hydroxy group, amino group, carboxy group, thiol group, methoxy group or the like, and the substituent is introduced to the main chain and/or the side chain of the polymer compound.

The introduced crosslink forming substituent can cause a crosslinking reaction with the crosslinking agent component contained in the resist underlayer coating forming composition of the present invention on baking under heating. The resist underlayer coating formed by the crosslink forming reaction has an effect for preventing intermixing between the resist underlayer coating and the resist coating coated thereon.

The polymer compound having a halogen atom can be synthesized by a polymerization of unit monomers containing a halogen atom, or a copolymerization of unit monomers containing halogen atoms with unit monomers containing no halogen atom.

In case where no crosslink forming substituent is present on the unit monomers containing halogen atoms, a crosslink forming substituent can be present on the unit monomers containing no halogen atom.

The unit monomers used for the polymerization may be the same each other, or a combination of two or more monomers can be used. The polymer compounds formed from the unit monomers can be synthesized by any methods such as radical polymerization, anionic polymerization, cationic polymerization, condensation polymerization or the like. The type of polymerization can be various methods such as solution polymerization, suspension polymerization, emulsion polymerization, bulk polymerization, or the like.

The unit monomer having a halogen atom includes for example acrylic acids, acrylic acid esters, acrylamides, methacrylic acids, methacrylic acid esters, methacrylamides, vinyl ethers, vinyl alcohols, styrenes, benzenes, phenols, naphthalenes, naphthanols, and so on.

The unit monomer having no halogen atom includes for example acrylic acids, acrylic acid esters, acrylamides, methacrylic acids, methacrylic acid esters, methacrylamides, vinyl ethers, vinyl alcohols, styrenes, benzenes, phenols, naphthalenes, naphthanols, and so on.

L in the structure of formula (1) is not specifically limited so long as it is a linking group constituting the main chain of the polymer compound, and includes for example (a-1) to (a-11) mentioned below:

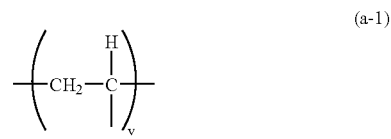
(a-1)

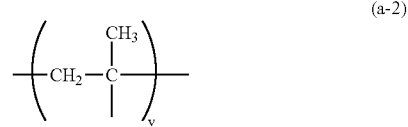
(a-2)

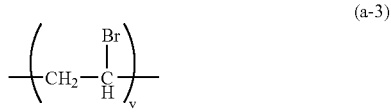
(a-3)

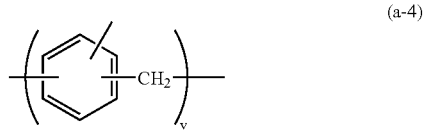
(a-4)

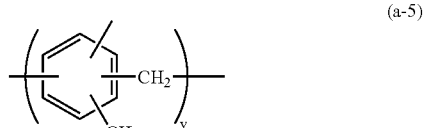
(a-5)

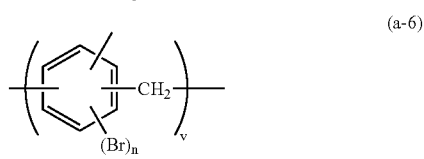
(a-6)

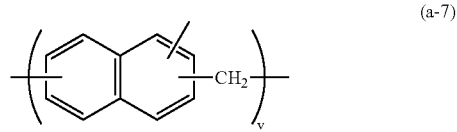
(a-7)

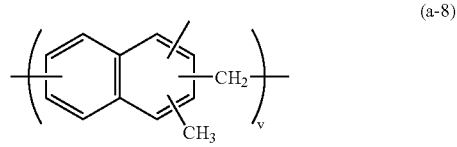
(a-8)

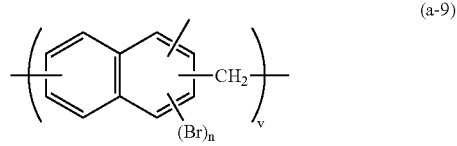
(a-9)

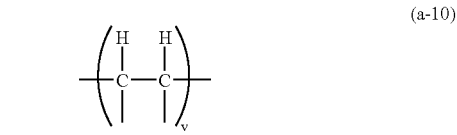
(a-10)

-continued (a-11)
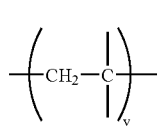

In the above-mentioned formulae, v is the number of repeating unit ranging from 1 to 3000, n is the number of halogen atoms substituted on the benzene ring or naphthalene ring, the number is 1 or more, and an arbitrary integer up to the maximum number that can be substituted.

M in formula (1) is a direct bond, or a linking group such as —C(=O)—, —C(=O)O—, —CH$_2$—, —CH(I)—, —O—, —C(=O)O—CH$_2$—, —C(=O)—NH—, —C(=O)—NH—CH$_2$—, —OC(=O)—, or —OC(=O)—CH$_2$—, or the like, and further (b-1) to (b-10):

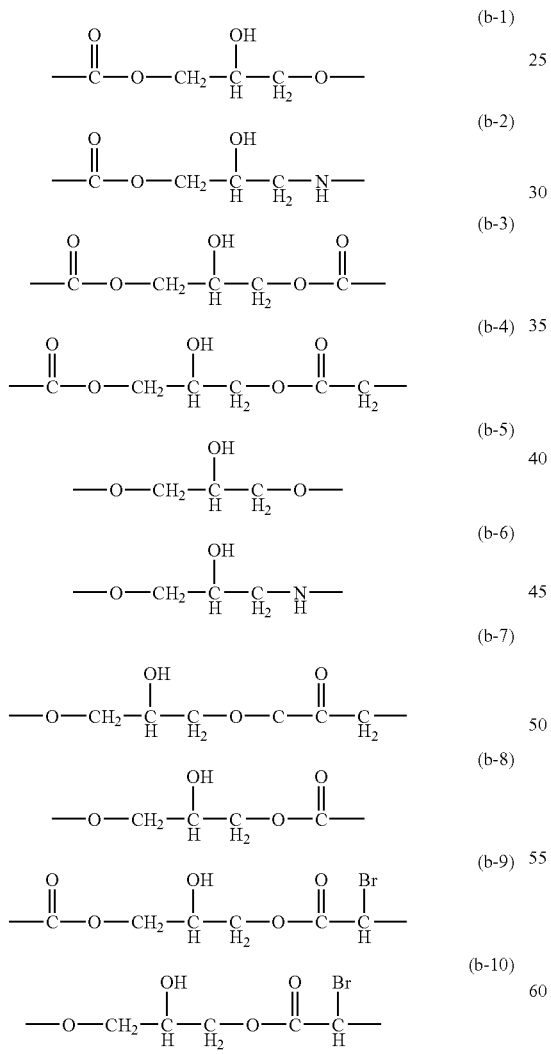

In addition, the moiety of Q in formula (1) is for example a halogen atom or an organic group having a halogen atom such as (c-1) to (c-10):

(c-1) —CH$_2$CH$_2$Br

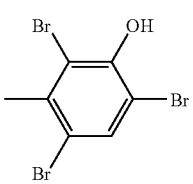
(c-2)

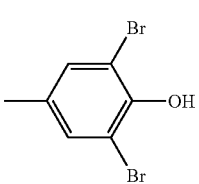
(c-3)

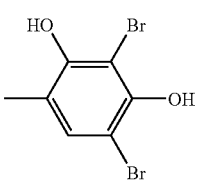
(c-4)

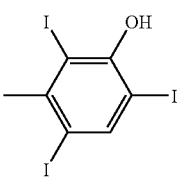
(c-5)

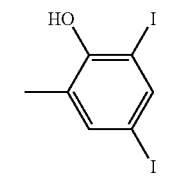
(c-6)

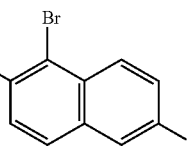
(c-7)

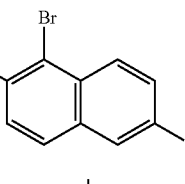
(c-8)

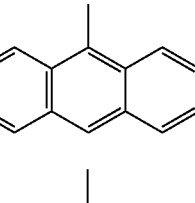
(c-9)

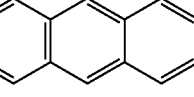
(c-10)

Hereinafter, the specific examples of the repeating structural unit containing a halogen atom contained in the polymer compound are exemplified:
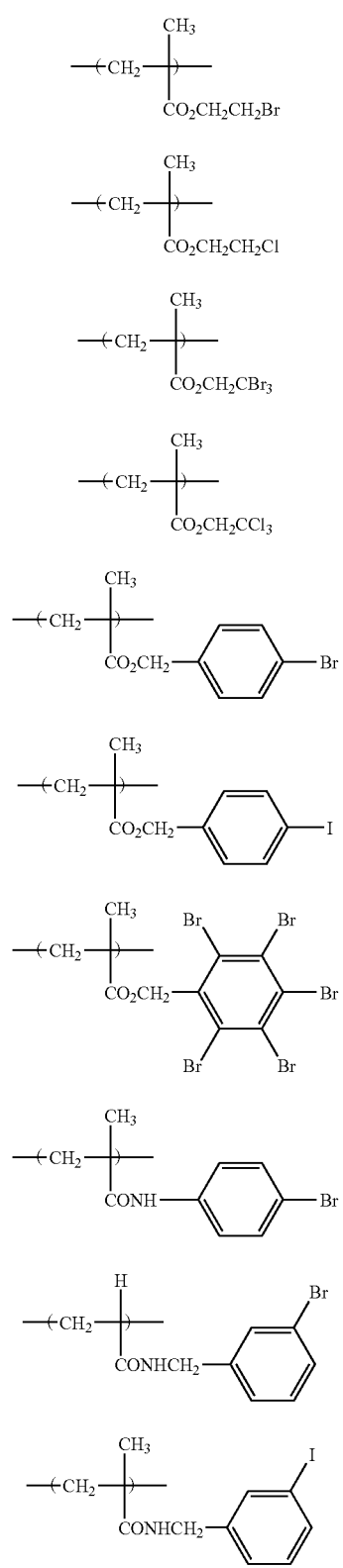
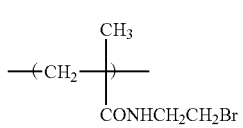
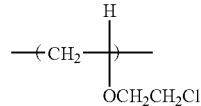
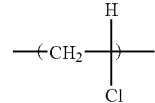
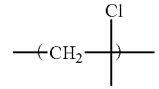
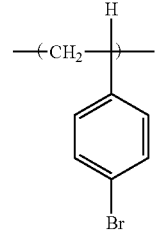
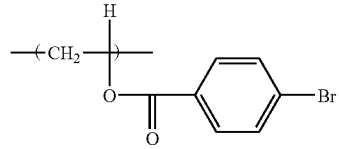
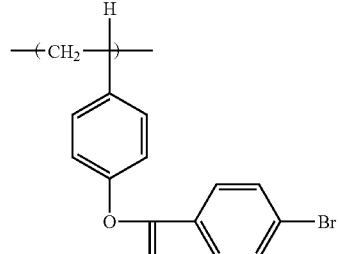
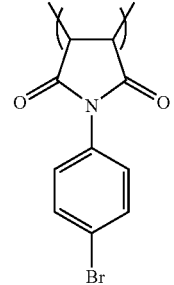

-continued
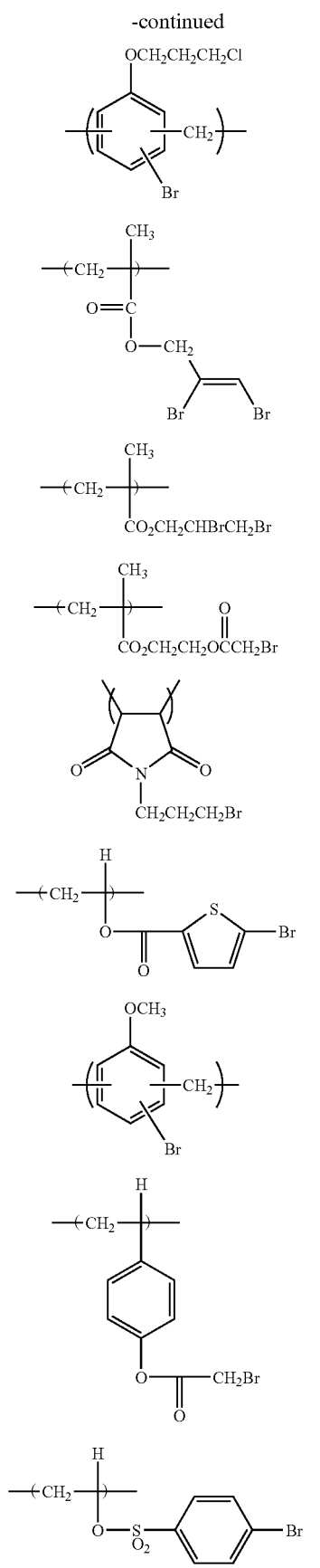
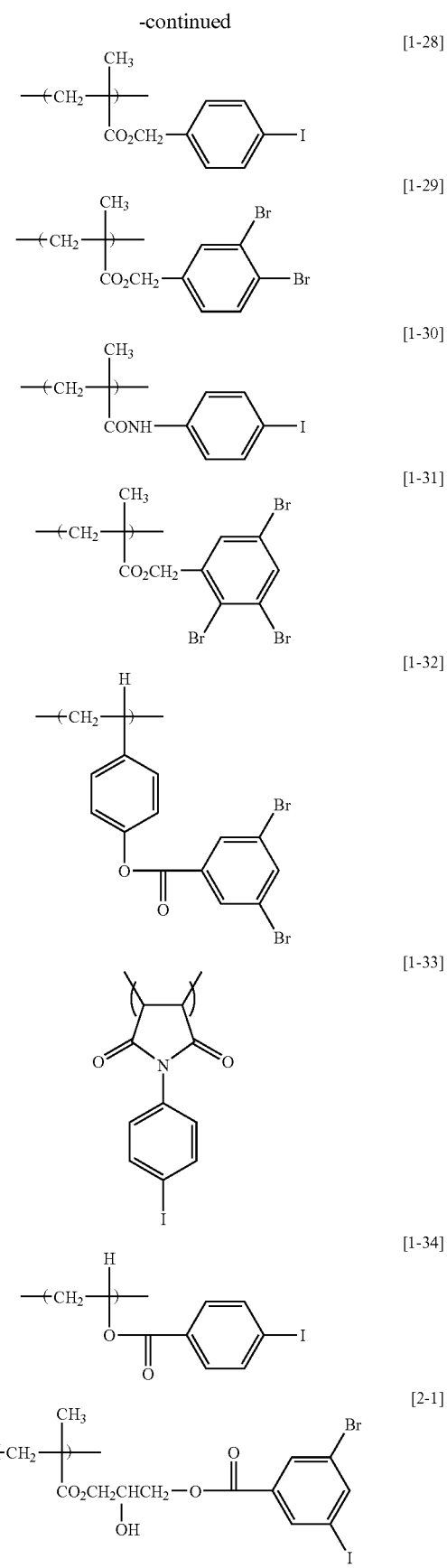

-continued
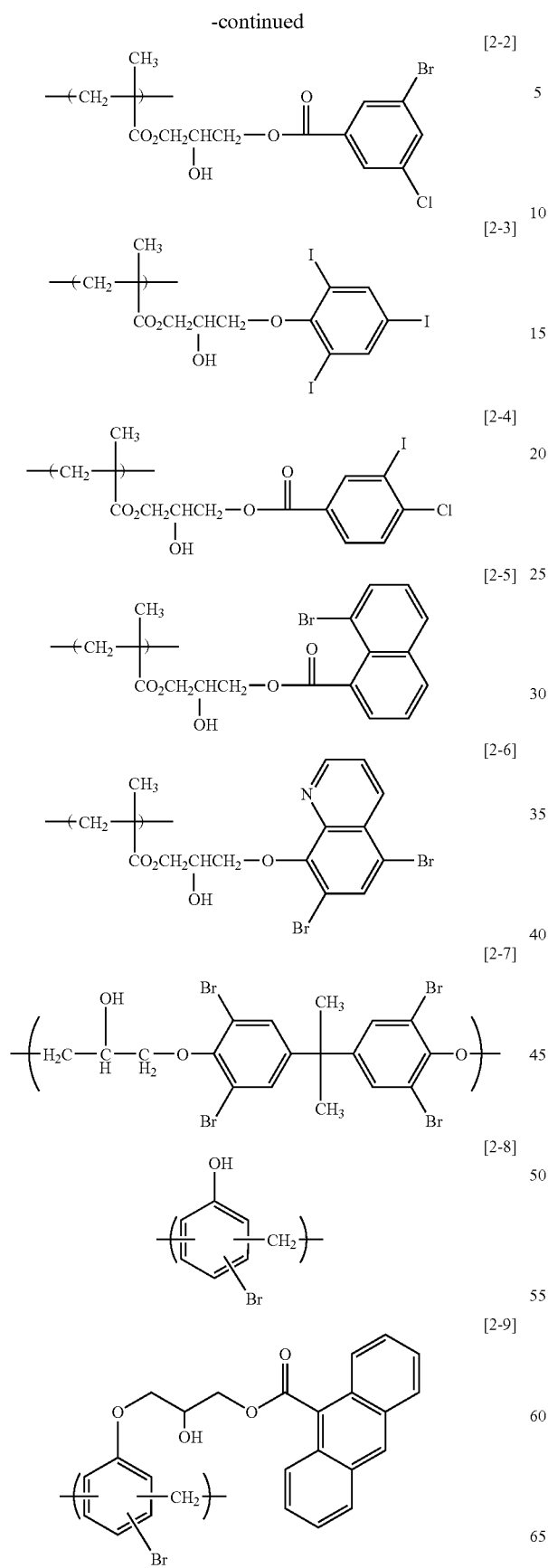
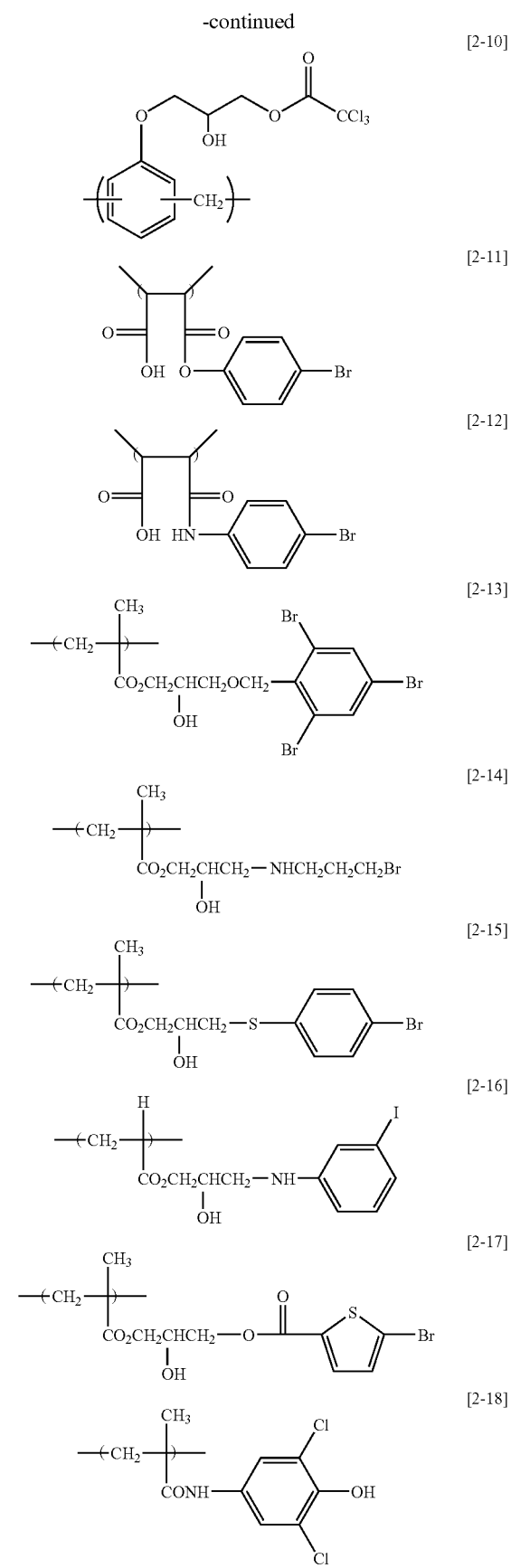

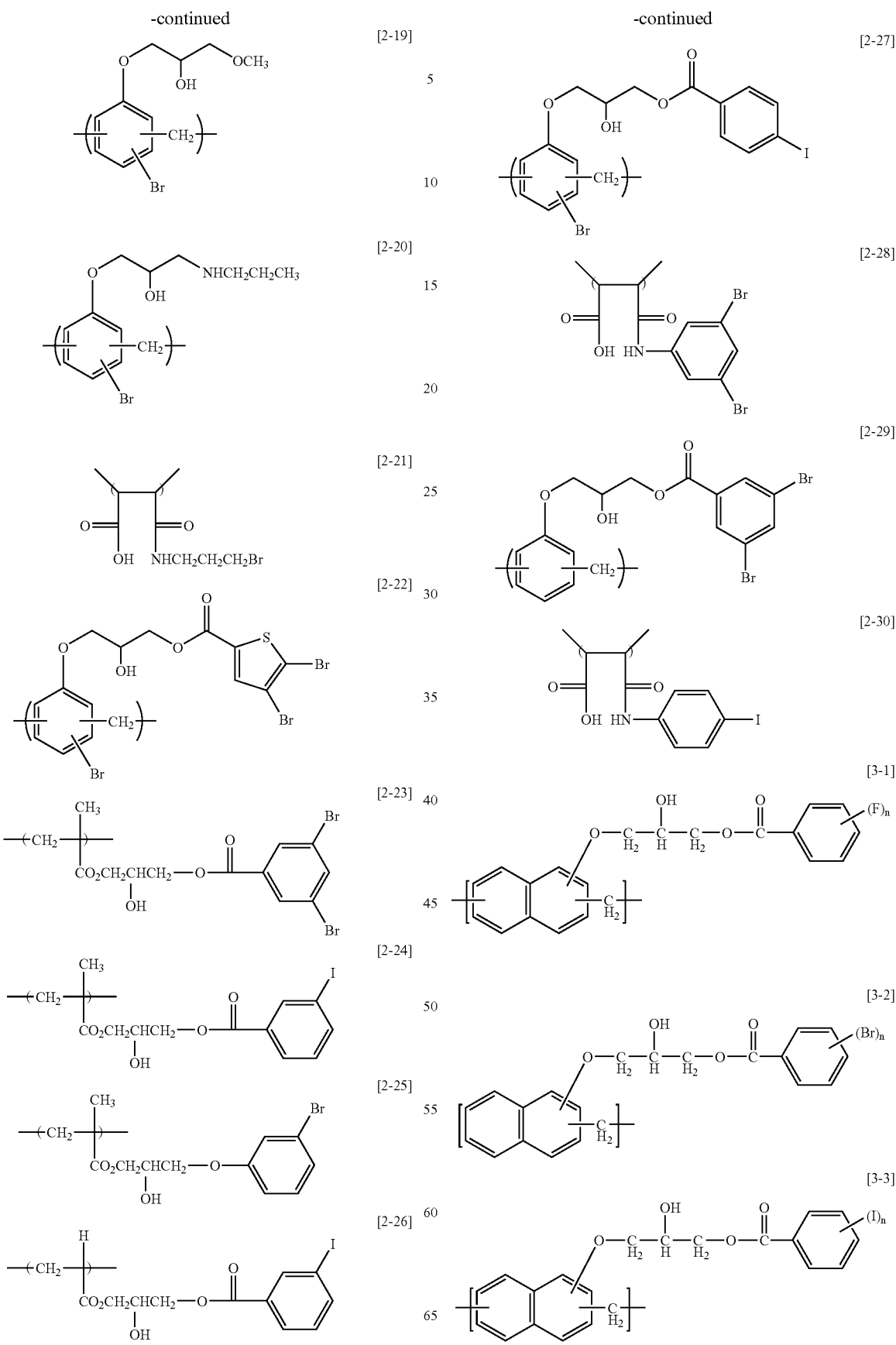

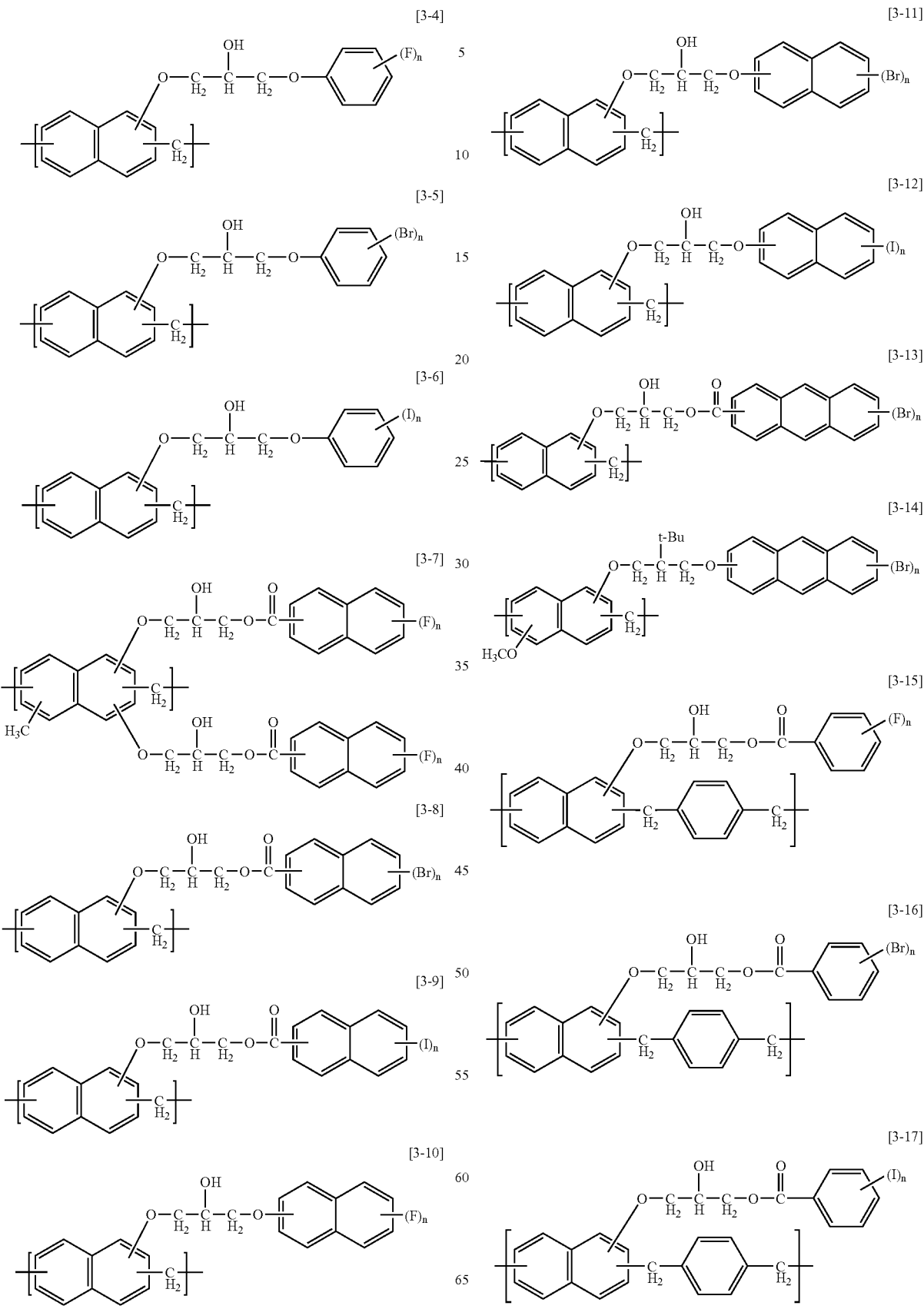

[3-18]
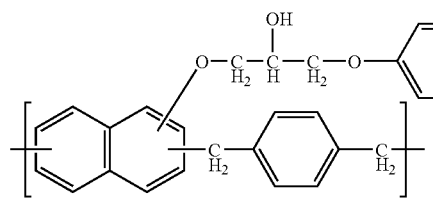

[3-24]
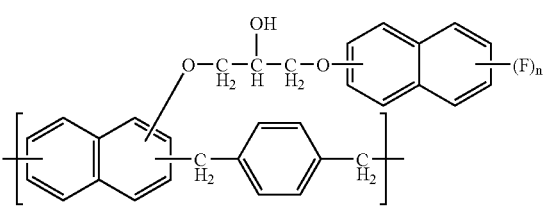

[3-19]
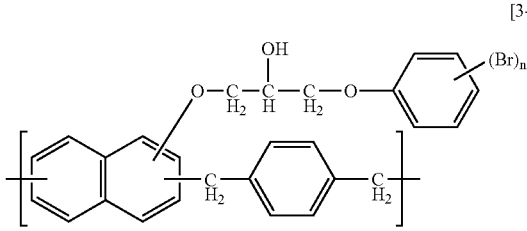

[3-25]
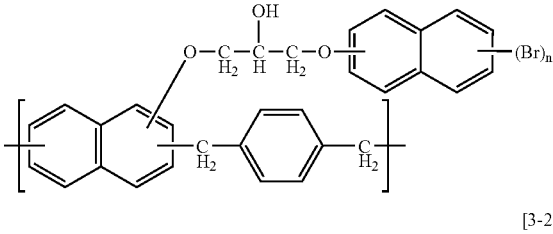

[3-20]
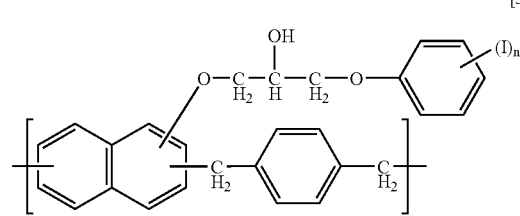

[3-26]
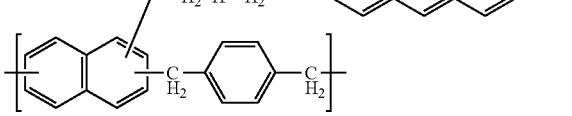

[3-21]
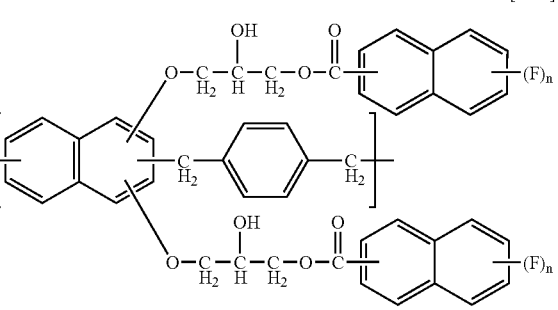

[3-27]
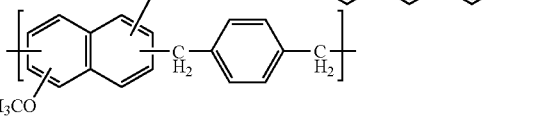

[3-22]
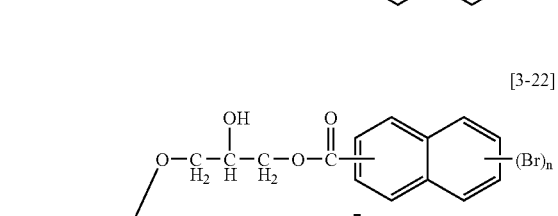

[3-23]
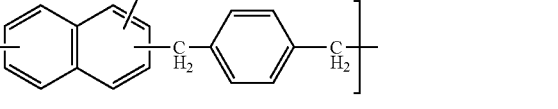

In formulae [3-1] to [3-27], n is the number of halogen atoms, on the benzene ring, naphthalene ring and anthracene ring, n is the number 1 to 5, 1 to 7 and 1 to 9, respectively.

Further, in case where no crosslink forming substituent is present on the polymer compound containing halogen atoms, repeating unit monomers having no halogen atom and having crosslink forming substituent can be copolymerized. The monomer structure includes for example the followings:

[4-1]
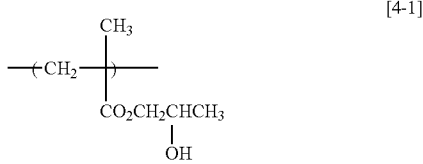

[4-2]
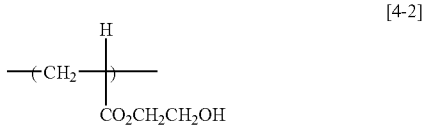

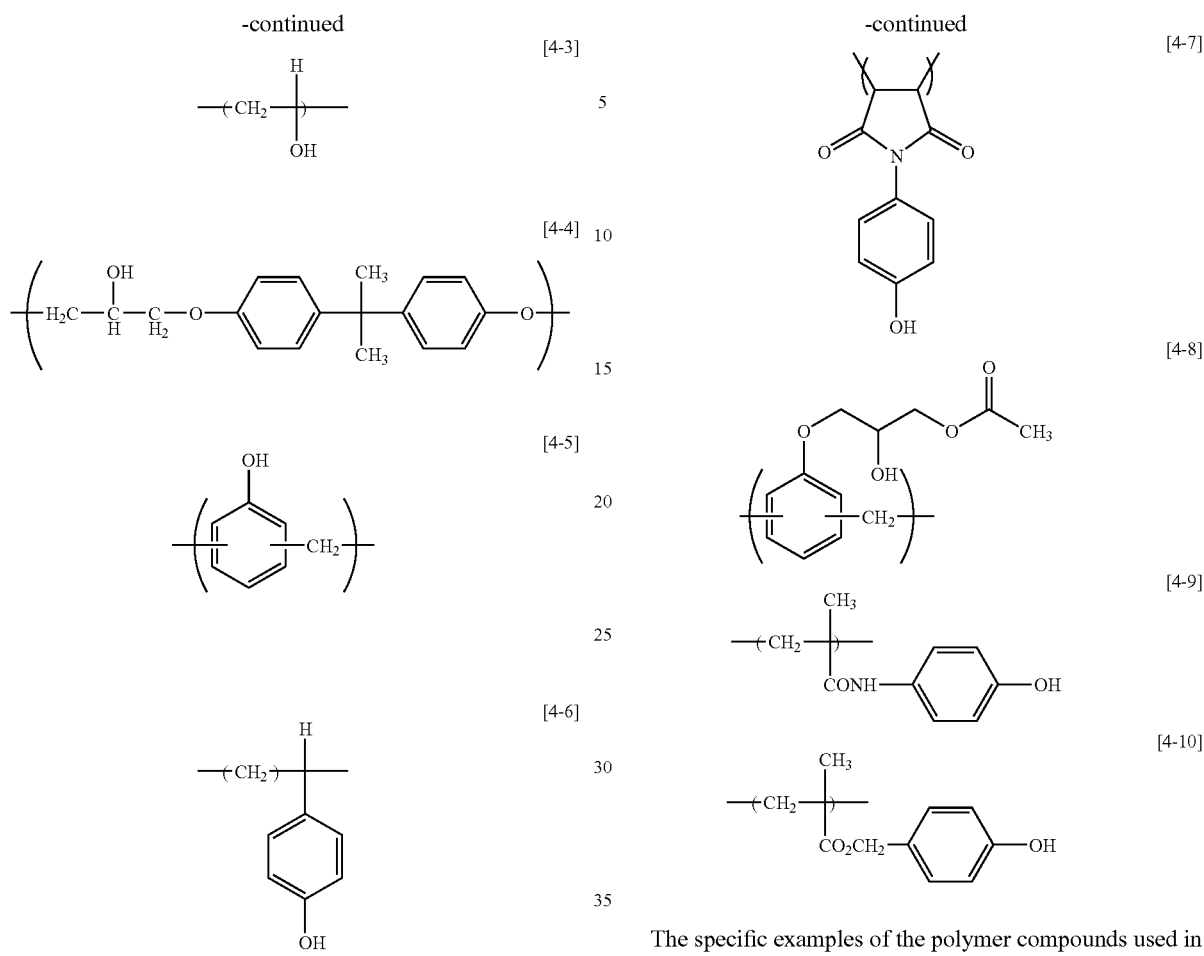
The specific examples of the polymer compounds used in the resist underlayer coating forming composition of the present invention are as follows:
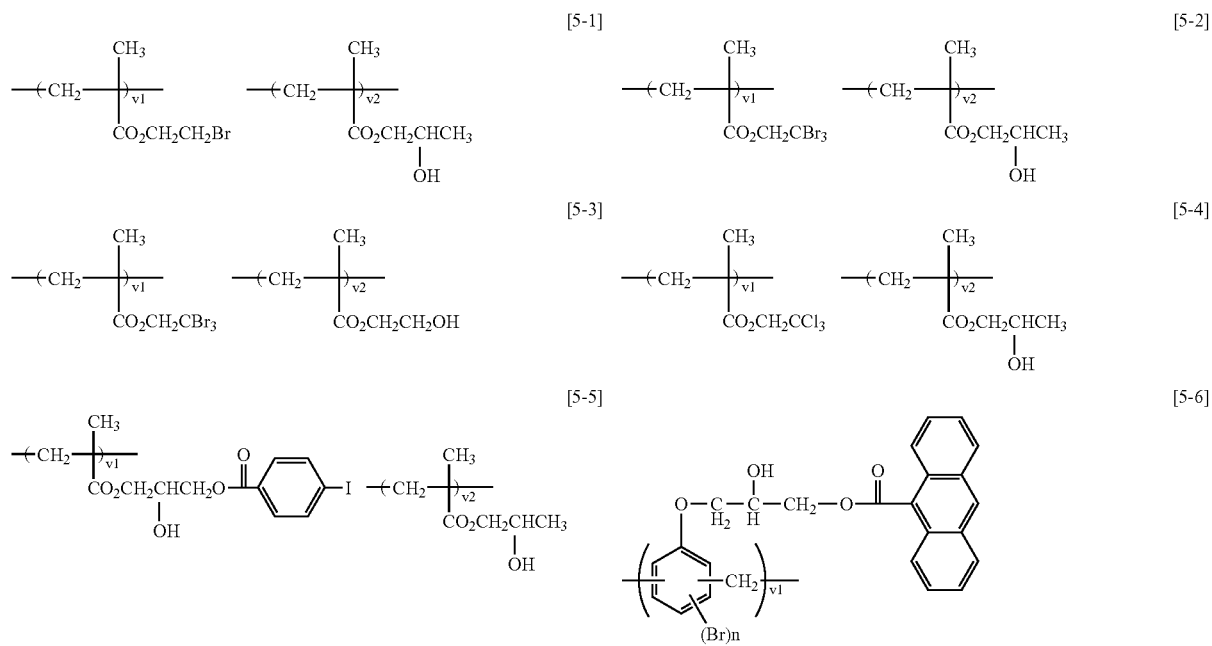

-continued
[5-7]
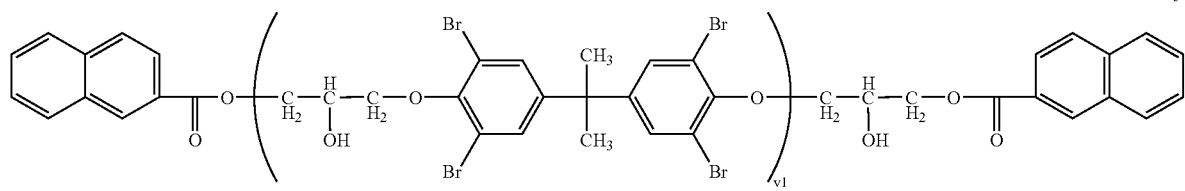
[5-8]
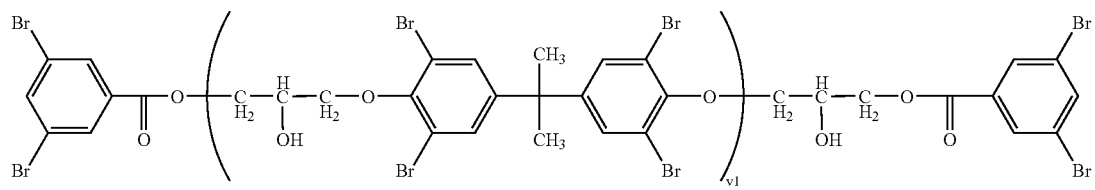
[5-9]
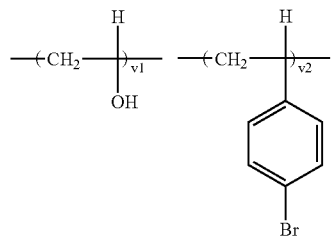
[5-10]
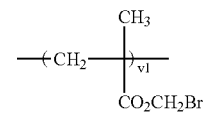
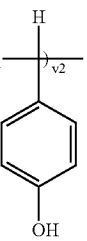
[5-11]
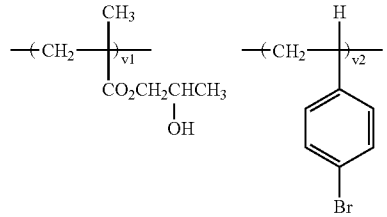
[5-12]
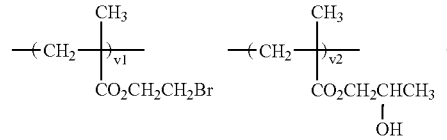
[5-13]
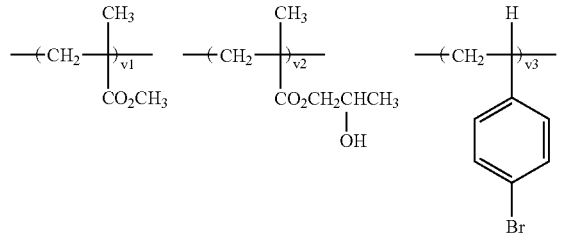
[5-14]
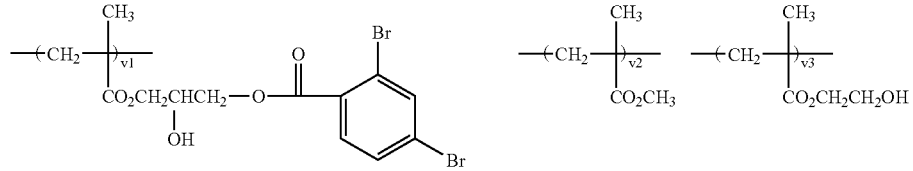
[5-15]
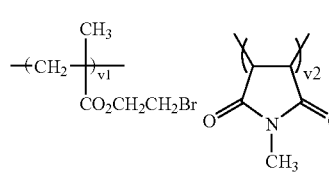
[5-16]
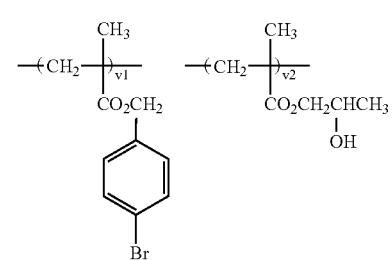

-continued
[5-17] 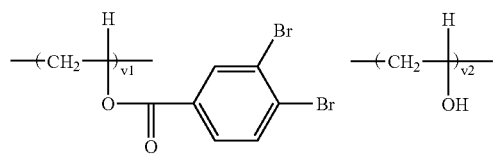
[5-18] 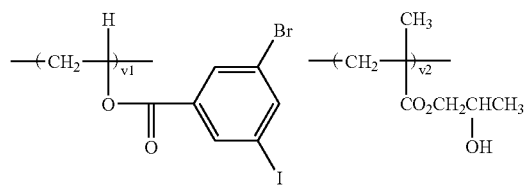
[5-19] 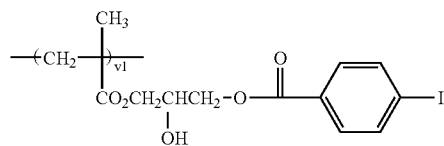
[5-20] 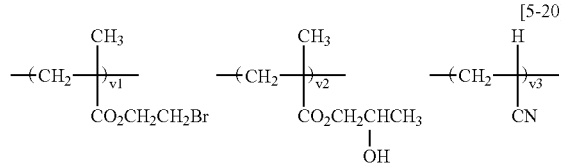
[5-21] 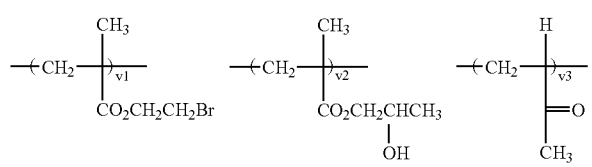
[5-22] 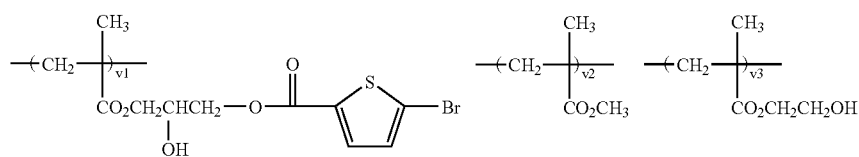
[5-23] 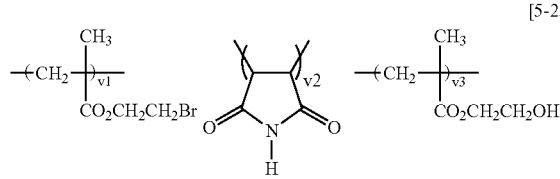
[5-24] 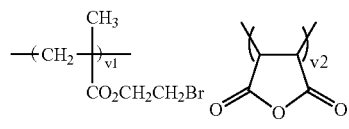
[5-25] 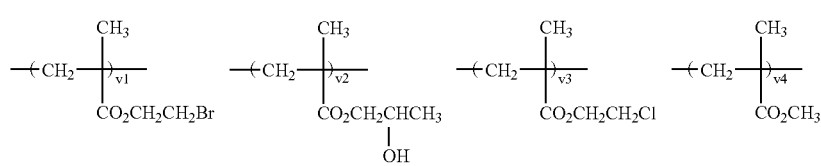
[5-26] 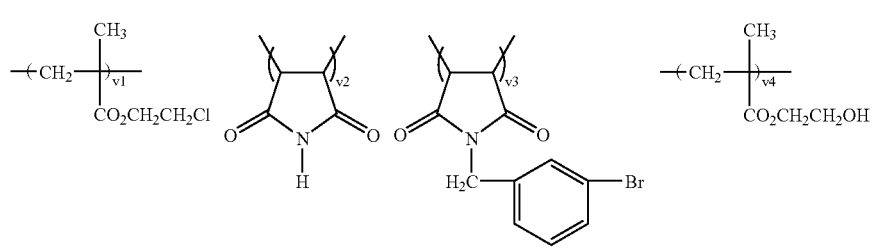
[5-27] [5-28] 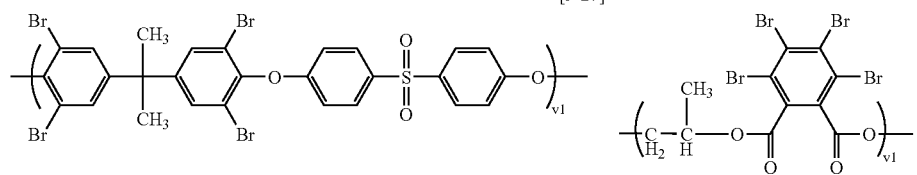

-continued
[5-29] 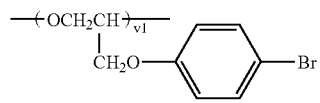
[5-30] 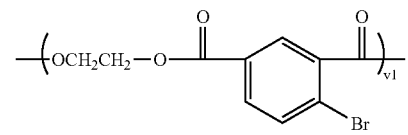
[5-31] 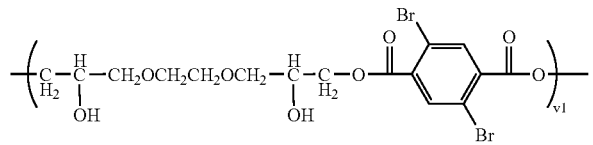
[5-32] 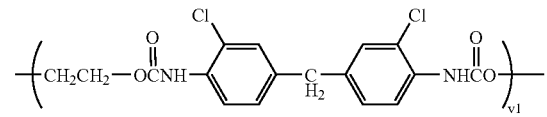
[5-33] 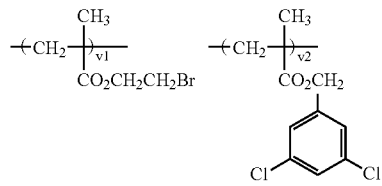
[5-34] 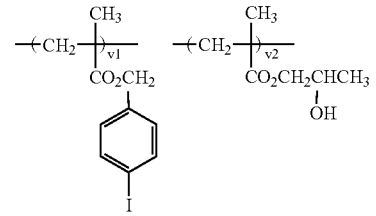
[5-35] 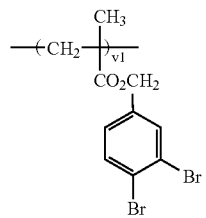
[5-36] 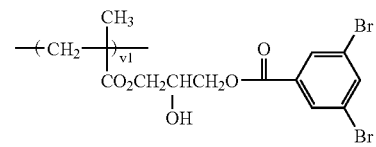
[5-37] 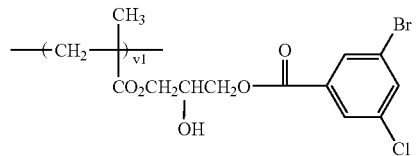
[5-38] 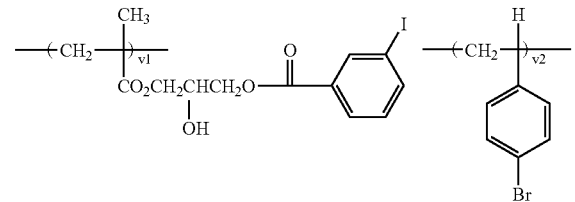
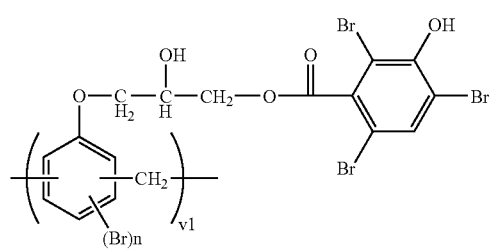
[5-40] 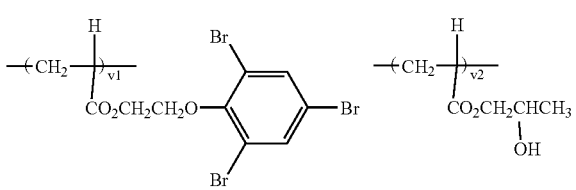
[5-41] 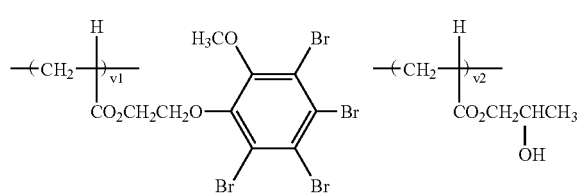
[5-42] 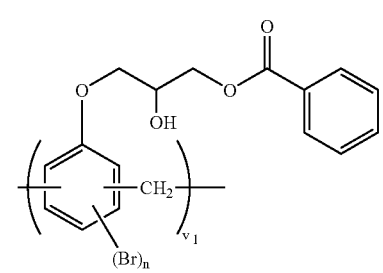

-continued
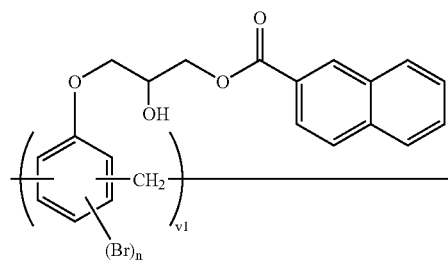 [5-43]
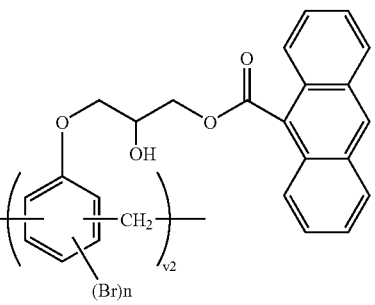
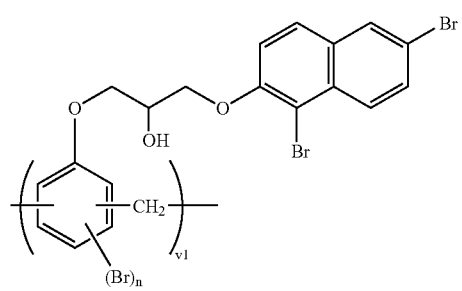 [5-44]
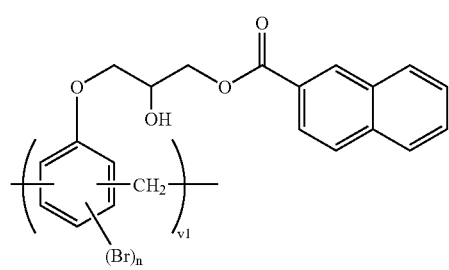 [5-45]
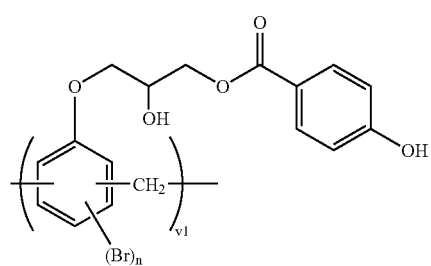 [5-46]
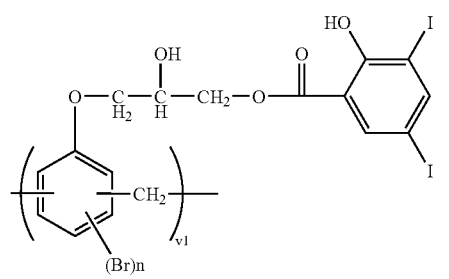 [5-47]
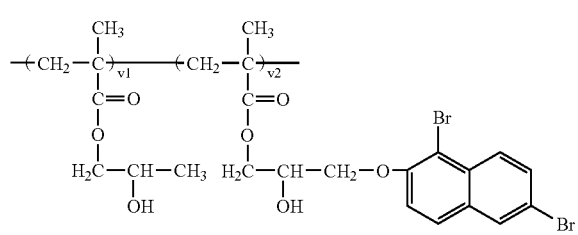 [5-48]
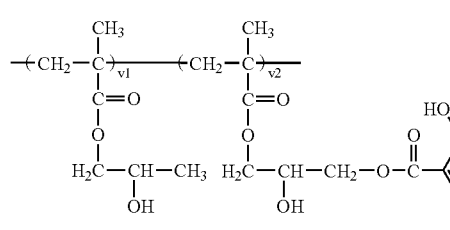 [5-49]
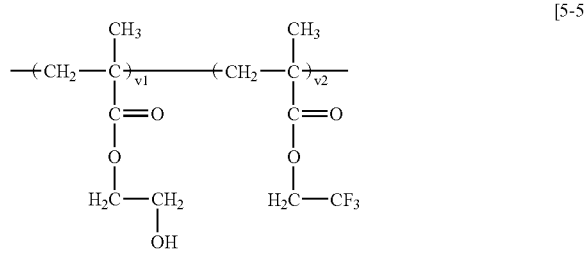 [5-50]
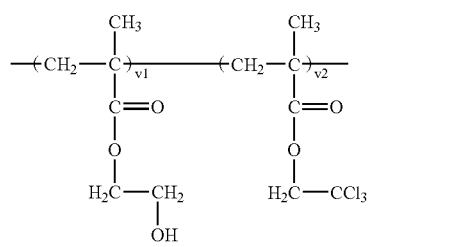 [5-51]
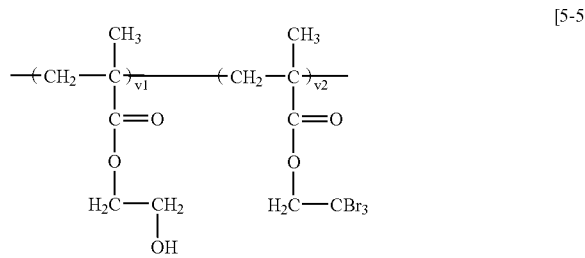 [5-52]
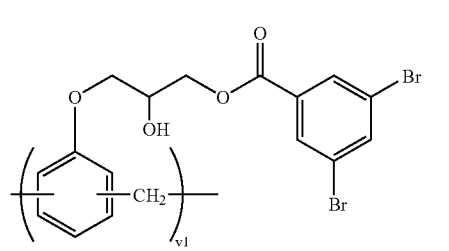 [5-53]

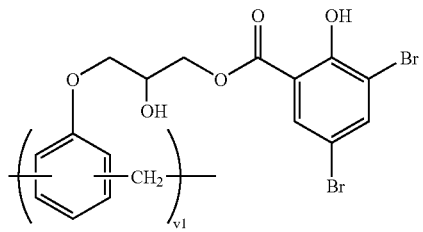
[5-54]

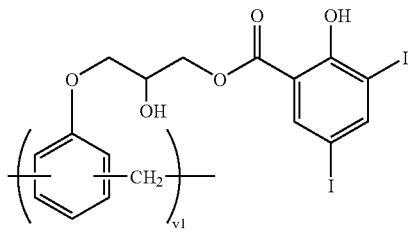
[5-55]

In [5-1] to [5-55], v1, v2 and v3 are the number of the repeating units, are 1 or more, and v1, v1+v2, v1+v2+v3 are the number of 3000 or less.

The polymerized products prepared from only the above-mentioned monomers of (1-1) to (1-34), (2-1) to (2-30), and (3-1) to (3-27), the copolymerized products prepared from these monomers and the above-mentioned monomers of (4-1) to (4-10), and the polymerized products mentioned above as specific examples have a weight average molecular weight of 700 to 1000000, preferably 700 to 500000, more preferably 900 to 300000

The resist underlayer coating forming composition of the present invention can alter the content (mass %) of halogen atom contained in the polymer compound in the composition. The selection of the main chain structure of the polymer compound, the selection of the kind of unit monomers used for the synthesis of the polymer compound, the selection of the kind of the compound to be reacted with the polymer obtained by a polymerization, or the selection of the number and the kind of halogen atoms contained therein makes possible to alter the content (mass %) of halogen atom contained in the polymer compound. The use of the polymer compounds that are different each other in the content (mass %) of halogen atom contained in the polymer compound makes possible to alter the content (mass %) of halogen atom in the solid content in the resist underlayer coating forming composition, that is, the content (mass %) of halogen atom in the resist underlayer coating after film-formation process. And, the alternation of the content (mass %) of halogen atom in the resist underlayer coating after film-formation process makes possible to control the attenuation coefficient (k) of the resist underlayer coating. In addition, the content (mass %) of halogen atom in the resist underlayer coating after film-formation process can be altered by changing the proportion of the polymer compound having a given halogen atom content in the solid content, and the attenuation coefficient (k) of the resist underlayer coating can be controlled also by this method. In this specification, the solid content in the resist underlayer coating forming composition means all components in the underlayer coating forming composition from which the solvent component is excluded. The content (mass %) of halogen atom in the resist underlayer coating after film-formation process means the content (mass %) of halogen atom in the solid content of the resist underlayer coating forming composition.

The resist underlayer coating forming composition of the present invention is preferably subjected to a crosslinking by heating after application in order to inhibit intermixing with the resist applied thereon, and the resist underlayer coating forming composition of the present invention can contain further a crosslinking agent component. The crosslinking agent includes melamine type compounds and substituted urea type compounds having crosslink forming substituent such as methylol group, methoxymethyl group, or the like, polymer compounds containing epoxy group, and so on. The crosslinking agents having at least two crosslink forming substituents, for example compounds such as methoxy methylated glycoluril or methoxy methylated melamine and so on are preferable, and tetramethoxymethyl glycoluril or hexamethoxymethylol melamine is particularly preferable. The added amount of the crosslinking agent varies depending on the used application solvent, the used base substrate, the required solution viscosity, the required film shape and so on, but is 0.001 to 20 mass %, preferably 0.01 to 15 mass %, more preferably 0.05 to 10 mass % based on 100 mass % of the total composition. Although the crosslinking agent may cause crosslinking reaction due to self condensation, in case where the crosslink forming substituent is present on the polymer compound used in the resist underlayer coating forming composition of the present invention, the crosslinking agent can cause a crosslinking reaction with the crosslink forming substituent.

The polymer compound having halogen atom-containing repeating structural units used in the resist underlayer coating forming composition for mask blank according to the present invention contains halogen atom-containing repeating structural units on the main chain, the side chain or both of them.

Preferable polymer compounds having halogen atom-containing repeating structural units include the compounds of general formulae (d), (e) and (f) described below:

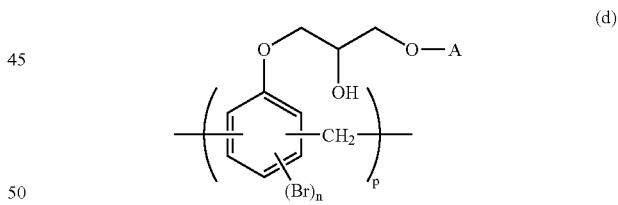
(d)

wherein A is phenyl group, naphthyl group, anthranyl group, benzoyl group, naphthyl carbonyl group or anthranyl carbonyl group (the phenyl group, naphthyl group, anthranyl group, benzoyl group, naphthyl carbonyl group and anthranyl carbonyl group may be arbitrarily substituted with hydroxy group, a halogen atom or both of hydroxy group and a halogen atom), p is an integer of 1 to 3000, n is an integer of 0 to 3, and the compound contains at least one halogen atom in the repeating units. The halogen atom is fluorine atom, chlorine atom, bromine atom or iodine atom, preferably bromine atom or iodine atom. Preferable A includes benzoyl group, naphthyl group or naphthyl carbonyl group (the benzoyl group, naphthyl group and naphthyl carbonyl group may be arbitrarily substituted with hydroxy group, a halogen atom or both of hydroxy group and a halogen atom), and A is benzoyl group, 1,6-dibromo-2-naphthyl group, 2-naphthyl carbonyl group, 4-hydroxy benzoyl group, 3,5-diiodo-2-hydroxy benzoyl group, 3,5-dibromobenzoyl group, or 3,5-dibromo-2-hydroxybenzoyl group.

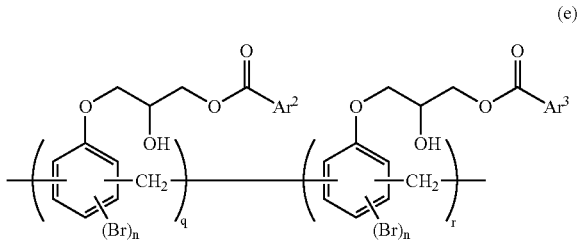

(e)

wherein $Ar^2$ and $Ar^3$ are not identical, are phenyl group, naphthyl group or anthranyl group (the phenyl group, naphthyl group and anthranyl group may be arbitrarily substituted with hydroxy group, a halogen atom or both of hydroxy group and a halogen atom), q and r independently of each other are an integer of 1 or more and q+r are an integer of 2 to 3000, n is an integer of 0 to 3, and the compound contains at least one halogen atom in the repeating unit containing the substituent $Ar^2$, in the repeating unit containing the substituent $Ar^3$, or in both the repeating unit containing the substituent $Ar^2$ and the repeating unit containing the substituent $Ar^3$.

Preferable $Ar^3$ includes anthranyl group and particularly 9-anthranyl group.

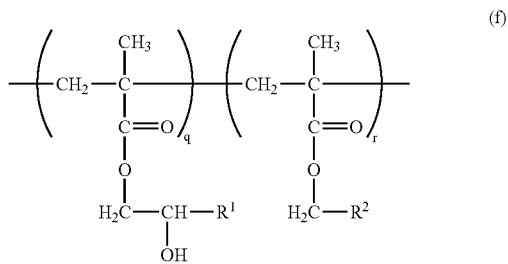

(f)

wherein $R^1$ is hydrogen atom or $C_{1-4}$alkyl group, $R^2$ is $CF_3$, $CCl_3$, $CBr_3$, $CH(OH)CH_2OR^3$ wherein $R^3$ is phenyl group, naphthyl group or anthranyl group (the phenyl group, naphthyl group and anthranyl group may be arbitrarily substituted with hydroxy group, a halogen atom or both of hydroxy group and a halogen atom), or $CH(OH)CH_2OC(O)R^4$ wherein $R^4$ is phenyl group, naphthyl group or anthranyl group (the phenyl group, naphthyl group and anthranyl group may be arbitrarily substituted with hydroxy group, a halogen atom or both of hydroxy group and a halogen atom), q and r independently of each other are an integer of 1 or more and q+r are an integer of 2 to 3000, and the compound contains at least one halogen atom in the repeating unit containing the substituent $R^2$.

As the catalyst for accelerating the crosslinking reaction, an acidic compound such as p-toluene sulfonic acid, trifluoromethane sulfonic acid, pyridinium p-toluene sulfonic acid, salicylic acid, sulfosalicylic acid, citric acid, benzoic acid, hydroxybenzoic acid or the like and/or a thermo-acid generator such as 2,4,4,6-tetrabromocyclohexadienone, benzoin tosylate, 2-nitrobenzyl tosylate or the like can be blended. The blending amount thereof is 0.02 to 10 mass %, preferably 0.04 to 5 mass % based on 100 mass % of the whole solid content.

The resist underlayer coating forming composition of the present invention can contain an acid generator for conforming the acidity to that of the resist applied thereon in the lithography process. Preferable acid generators are for example onium salt type acid generators such as bis(4-tert-butylphenyl)iodonium trifluoromethane sulfonate, triphenylsulfonium trifluoromethane sulfonate or the like, halogen-containing compound type acid generators such as phenyl-bis(trichloromethyl)-s-triazine or the like, sulfonic acid type acid generators such as benzoin tosylate, N-hydroxysuccinimide trifluoromethane sulfonate or the like, and so on.

The added amount of the acid generator is 0.02 to 3 mass %, preferably 0.04 to 2 mass % based on 100 mass % of the whole solid content.

The resist underlayer coating formning composition of the present invention can contain further rheology controlling agents, adhesion auxiliaries, surfactants, etc. if necessary, in addition to the above-mentioned components.

The rheology controlling agents are added mainly for improving fluidity of the resist underlayer coating forming composition. The specific examples thereof are phthalic acid derivatives such as dimethyl phthalate, diethyl phthalate, diisobutyl phthalate, dihexyl phthalate, butyl isodecyl phthalate, etc., adipic acid derivatives such as di-n-butyl adipate, diisobutyl adipate, diisooctyl adipate, octyldecyl adipate, etc., maleic acid derivatives such as di-n-butyl maleate, diethyl maleate, dinonyl maleate, etc., oleic acid derivatives such as methyl oleate, butyl oleate, tetrahydrofurfuryl oleate, etc., stearic acid derivatives such as n-butyl stearate, glyceryl stearate, etc. The rheology controlling agents are blended in a proportion of usually less than 300 mass % based on 100 mass % of the whole resist underlayer coating forming composition.

The adhesion auxiliaries are added mainly for improving adhesion of the resist underlayer coating forming composition with the substrate or the resist, particularly for preventing removing of the resist in development. The specific examples thereof are chlorosilanes such as trimethylchlorosilane, dimethylvinylchlorosilane, methyl diphenylchlorosilane, chloromethyldimethyl chlorosilane, etc., alkoxysilanes such as trimethylmethoxysilane, dimethyldiethoxysilane, methyldimethoxysilane, dimethylvinylethoxysilane, diphenyldimethoxysilane, phenyltriethoxysilane, etc., silazanes such as hexamethyidisilazane, N,N'-bis(trimethylsiline)urea, dimethyltrimethylsilylamine, trimethylsilylimidazole, etc., silanes such as vinyltrichlorosilane, γ-chloropropyltrimethoxysilane, γ-aminopropyltriethoxysilane, γ-glycidoxypropyltrimethoxysilane, etc., heterocyclic compounds such as benzotriazole, benzimidazole, indazole, imidazole, 2-mercaptobenzimidazole, 2-mercaptobenzothiazole, 2-mercaptobenzoxazole, urazole, thiouracyl, mercaptoimidazole, mercaptopydrmidine, etc., ureas such as 1,1-dimethylurea, 1,3-dimethylurea, etc., and thiourea compounds, and so on. The adhesion auxiliaries are blended in a proportion of usually less than 5 mass %, preferably less than 2 mass % based on 100 mass % of the whole resist underlayer coating forming composition.

The resist underlayer coating forming composition of the present invention can contain surfactants for preventing the occurrence of pinholes or striations and further increasing coatability not to cause surface unevenness. As the surfactants, mention may be made of, for example, nonionic surfactants such as polyoxyethylene alkyl ethers, e.g., potyoxyethylene lauryl ether, polyoxyethylene stearyl ether, polyoxyethylene cetyl ether, polyoxyethylene oleyl ether, etc., polyoxyethylene alkyl allyl ethers, e.g., polyoxyethylene octyl phenol ether, polyoxyethylene nonyl phenol ether, etc., polyoxyethylene/polyoxypropylene block copolymers, sorbitan fatty acid esters, e.g., sorbitan monolaurate, sorbitan monopalmitate, sorbitan monostearate, sorbitan monooleate, sorbitan trioleate, sorbitan tristearate, etc., polyoxyethylene sorbitan fatty acid esters, e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate, etc.; fluorine based surfactants, e.g., trade name: EFTOP EF301, EF303, EF352 (manufactured by Tochem Products Co., Ltd.), trade name: MEGAFAC F171, F173 (manufactured by Dainippon Ink and Chemicals, Inc.), trade name: FLUORAD FC430, FC431 (manufactured by Sumitomo 3M Limited), trade name: ASAHI GUARD AG710, SURFLON S-382, SC101, SC102, SC103, SC104, SC105, SC106 (manufactured by Asahi Glass Co., Ltd.); organosiloxane polymer KP341 (manufactured by Shinetsu Chemical Co., Ltd.), etc. The blending amount of the surfactants is usually 0.2 mass % or less, preferably 0.1 mass % or less, based on 100 mass % of the whole resist underlayer coating forming composition of the present invention. The surfactants may be added singly or in combination of two or more.

The solvents for dissolving the above-mentioned polymer that can be used include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, etc. These solvents may be used singly or in combination of two or more.

Further, high boiling solvents such as propylene glycol monobutyl ether or propylene glycol monobutyl ether acetate, etc. may be mixed and used. Among these solvents, propylene glycol monomethyl ether, propylene glycol monomethyl ether acetate, ethyl lactate, butyl lactate, and cyclohexanone are preferable from viewpoint of improvement in leveling property.

As the resist to be applied on the resist underlayer coating in the present invention, any of negative type and positive type resists can be used. The resist includes a chemically-amplified type resist consisting of an acid generator and a binder having a group which is decomposed with an acid and changes alkali dissolution rate, a chemically-amplified type resist consisting of an alkali-soluble binder, an acid generator, and a low molecular compound which is decomposed with an acid and changes the alkali dissolution rate of the resist, a chemically-amplified resist consisting of an acid generator, a binder having a group which is decomposed with an acid and changes the alkali dissolution rate, and a low molecular compound which is decomposed with an acid and changes the alkali dissolution rate of the resist.

Also, a non chemically amplified resist consisting of a binder having a group which is decomposed by electron beam and changes alkali dissolution rate of the resist, a non chemically amplified resist consisting of a binder having a chemical part which is cut by electron beam and changes alkali dissolution rate of the resist is described.

The developer for positive type resists having the resist underlayer coating formed by use of the resist underlayer coating forming composition of the present invention includes an aqueous solution of alkalis for example inorganic alkalis such as sodium hydroxide, potassium hydroxide, sodium carbonate, sodium silicate, sodium metasilicate, ammonia water, or the like, primary amines such as ethyl amine, n-propyl amine, or the like, secondary amines such as diethyl amine, di-n-butyl amine, or the like, tertiary amines such as triethyl amine, methyldiethyl amine, or the like, alcohol amines such as dimethylethanol amine, triethanol amine, or the like, quaternary ammonium salts such as tetramethylammonium hydroxide, tetraethylammonium hydroxide, choline or the like, cyclic amines such as pyrrole, piperidine, or the like, and so on. Further, in the above-mentioned aqueous solution of alkalis, alcohols such as isopropyl alcohol or the like, or surfactants such as nonionic surfactants or the like can be added in a suitable amount, and can be used. Among them, preferable developers are quaternary ammonium salts, more preferably tetramethylammonium hydroxide and choline.

Then, the resist underlayer coating prepared from the resist underlayer coating forming composition containing the polymer compound having the halogen atom-containing repeating structural units has a relatively high dry etching rate due to the inclusion of halogen atom. In addition, the dry etching rate can be controlled by altering the content of the halogen atom.

The mask blank for which the resist underlayer coating forming composition of the present invention is applied has the following constitutions.

(Constitution 1) In a mask blank in which a chemically-amplified type resist coating is formed, a substrate, a thin film for forming transfer pattern formed on the substrate, and a resist underlayer coating are formed in that order, the resist underlayer coating is formed by coating the resist underlayer coating forming composition comprising a polymer compound having a halogen atom-containing repeating structural unit and a solvent on the thin film for forming transfer pattern, and heat-treating. The resulting resist underlayer coating enables the film thickness of the chemically-amplified type resist coating for acquiring anti-deactivation effect to reduce, and the chemically-amplified type resist coating is not substantially etched during etching of the resist underlayer coating as the resist underlayer coating has a high etching rate. Therefore, the thin film for forming transfer pattern can be etched in a state that the resolving property of the resist pattern right after forming is kept. Thus, the resolving property of the thin film for forming transfer pattern can be improved.

The chemically-amplified type resist coating is a resist coating developing a resist function by reaction of the acid of a catalyst substance generated in the resist coating for example by electron beam with the functional group or functional substance suppressing the solubility of the polymer in the subsequent heat-treating process. To develop a resist function is for example to become dissoluble in any alkalis by removing functional groups or the like. The chemically-amplified type resist coating is preferably resist-depicted (exposed to light) by use of an electron beam accelerated with an accelerating voltage of 50 keV or more.

In case where the film thickness of the resist underlayer coating is set to 25 nm or less and the thin film for forming transfer pattern is etched by use of the chemically-amplified type resist coating as a mask, it is desirable that the etching rate of the resist underlayer coating is 1.0 time or more, preferably 1.1 to 10 times of that of the chemically-amplified type resist coating.

In case where the film thickness of the resist underlayer coating is large (for example 30 nm or more) and the resist underlayer coating having a low etching rate is formed, the resist coating is also etched while the resist underlayer coating is etched, and the resist underlayer coating becomes an inhibition factor for an improvement in the resolving property of the thin film for forming transfer pattern, and thus the above-mentioned conditions are not desirable.

(Constitution 2) The resist underlayer coating obtained according to the present invention can exert a sufficient anti-deactivation effect even in an extremely thin film thickness of for example about 5 nm. In addition, it can suitably improve etching rate. Therefore, the resist underlayer coating having an extremely thin film thickness and a high etching rate can be formed.

(Constitution 3) The present invention is used for a mask blank in which a chemically-amplified type resist coating is formed, and the mask blank is composed of a substrate, a thin film for forming transfer pattern formed on the substrate, and a resist underlayer coating for inhibiting deactivation of the chemically-amplified type resist coating formed on the thin film for forming transfer pattern. This constitution makes possible to form the resist underlayer coating having an extremely thin film thickness and a high etching rate. In addition, this constitution can improve the resolving property of the patterning of the thin film for forming transfer pattern.

(Constitution 4) In the mask blank for which the resist underlayer coating forming composition of the present invention is applied, the thin film for forming transfer pattern is suitably made of a material containing chromium. Concretely, the thin film for forming transfer pattern is an opaque film (a light-shielding film) for shielding exposure light, the opaque film (the light-shielding film) has an under-layer mainly composed of at least chromium carbide (CrC) and an upper-layer having an anti-reflective property mainly composed of at least one chromium oxide or chromium nitride. The anti-reflective layer is for example a layer in which oxygen and nitrogen are added in chromium (CrON coating). The anti-reflective layer may a layer mainly composed of chromium oxide (CrO). In addition, a layer mainly composed of chromium nitride (CrN) may be further provided under the layer mainly composed of chromium carbide.

If a chromium type opaque film (the light-shielding film) is used as a thin film for forming transfer pattern, the opaque film (the light-shielding film) is dry etched for example with chlorine-based gas or fluorine-based gas, etc. In this case, when the resist underlayer coating has a large film thickness or a low etching rate, the resist coating is etched while the resist underlayer coating is etched, the resolving property of the resulting resist pattern is lowered. However, the adoption of Constitution 4 in which a resist underlayer coating with a thin film thickness and a high etching rate is used makes possible to suitably prevent the lowering in the resolving property of the resist pattern by dry etching the chromium type opaque film.

(Constitution 5) In a mask blank for which the resist underlayer coating forming composition of the present invention is applied, a silicide film is formed under the resist underlayer depositing, the adhesion of the resist underlayer coating to the silicide film is higher than the adhesion of a chemically-amplified type resist coating that would be formed on a silicide film to the silicide film. The adoption of this constitution makes possible to improve the adhesion between the silicide film and the chemically-amplified type resist coating. Therefore, the chemically-amplified type resist coating can be suitably formed on the silicide film. In the meanwhile, the silicide film is a film used for example as a hard mask. The adoption of this constitution makes possible to suitably use the chemically-amplified type resist coating in hard mask blanks.

In this case, in order to improve the adhesion between the silicide film and the chemically-amplified type resist coating, for example a pre-treatment with a silane coupling agent (HMDS, etc.) may be carried out. However, this pre-treatment leads to an increase in cost due to an increase in the number of steps. On the contrary, the adoption of Construction 5 makes possible to improve the adhesion between the silicide film and the chemically-amplified type resist coating by utilizing the resist underlayer coating. Thus, the adhesion can be improved without any increase in the number of steps, and the cost for mask blanks can be lowered.

(Constitution 6) The present invention is applied for a mask blank in which a chemically-amplified type resist coating is formed, and the mask blank is composed of a substrate, a thin film for forming transfer pattern formed on the substrate, a silicide film formed on thin film for forming transfer pattern and a resist underlayer coating according to the present invention formed on the silicide film, the chemically-amplified type resist coating is formed on the underlayer coating.

The adhesion of the underlayer coating to the silicide film is higher than the adhesion of a chemically-amplified type resist coating that would be formed on a silicide film to the silicide film, and the film thickness of the underlayer coating is 25 nm or less.

In case where the silicide film is etched by use of the patterned chemically-amplified type resist coating as a mask, the etching rate of the underlayer coating 1.0 time or more of that of the chemically-amplified type resist coating. The adoption of this constitution makes possible to suitably improve the adhesion between the silicide film and the chemically-amplified type resist coating. In addition, it enables a suitable improvement in the resolving property of the patterning of the silicide film.

(Constitution 7) The present invention is applied for a mask blank in which a chemically-amplified type resist coating is formed, and the mask blank is composed of a substrate, a silicide film formed on the substrate, and a resist underlayer coating according to the present invention formed on the silicide film, the chemically-amplified type resist coating is formed on the underlayer coating. The adoption of this constitution makes possible to suitably improve the adhesion between the silicide film and the chemically-amplified type resist coating. In addition, it enables a suitable improvement in the resolving property of the patterning of the silicide film.

(Constitution 8) A mask blank for which the present invention is applied includes a chemically-amplified type resist coating. The adoption of this constitution enables a suitable improvement in the resolving property of the patterning of the thin film for forming transfer pattern or the silicide film. Further, it makes possible to suitably inhibit deactivation of the chemically-amplified type resist coating.

(Constitution 9) It is able to produce a mask having a mask pattern formed by patterning the thin film for forming transfer pattern in the mask blank described in any one of Constitutions 1 to 8. The adoption of this constitution makes possible to acquire the effects in Constitutions 1 to 8.

In the meanwhile, the above-mentioned mask blank includes transmission type mask blanks such as photomask blank, phase shift mask blank, etc., or reflection type mask blanks. Further, the mask blank includes a blank with resist coating, or a blank that a resist coating has not been formed yet.

The phase shift mask blank includes a case in which an opaque film (a light-shielding film) composed of a chromium-based material on a halftone film. In this case, the thin film for forming transfer pattern corresponds to the halftone film or the opaque film. The mask includes transmission type masks such as photomask, phase shift mask, etc., or reflection type masks. The mask includes a reticle. The reflection type mask blanks mean a structure that a multi-layer reflection film and an absorber film are formed on a substrate, or a structure that a multi-layer reflection film, a buffer layer and an absorber film are formed on a substrate. In this case, the thin film for forming transfer pattern corresponds to the absorber film or both the absorber film and the buffer layer.

In addition, the opaque film concretely includes an opaque film for shielding exposure light. The film material, film structure, film thickness and the like of the opaque film are not specifically limited. The film material of the opaque film includes a material composed of only chromium, or a material composed of chromium and at least one element consisting of oxygen, nitrogen or carbon (Cr-containing material), or the firm material may be a film material from which a projection in a bottom-extended shape is formed at the bottom of the resist pattern when a chemically-amplified type resist coating such as acetal based resist for LEAR (Low Energy Activation Resist) or SCAP based resist for HEAR (High Energy Activation Resist), or the like is used.

The film formulation of the opaque film is appropriately controlled depending on optical properties (optical concentration, reflectance or the like in photomask blank). The film structure of the opaque film may be a mono-layer composed of the above-mentioned film material, or a multi-layer structure. In case having different formulation, a multi-layer structure formed stepwise or a film structure in which the formulation is continuously changed may be adopted. The film thickness of the opaque film is appropriately controlled depending on optical properties (optical concentration or the like in photomask blank). In case of photomask blank, film thickness of the opaque film is for example 30 to 150 nm.

According to the present invention, in case where a chemically-amplified type resist coating is used in a mask blank, the resolving property of patterning of a thin film for forming transfer pattern can be increased. In addition, in case where a silicide film is used as a base layer of a chemically-amplified type resist coating, the adhesion between the silicide film and the chemically-amplified type resist coating can be improved.

Hereinafter, the embodiments of the mask blank for which the resist underlayer coating forming composition of the present invention is applied will be described by reference to drawings.

FIG. 1 is a drawing showing an example of a first embodiment of mask blank 10 for which the resist underlayer coating forming composition of the present invention is applied. In this embodiment, the mask blank 10 is a mask blank for binary mask, and includes a transparent substrate 12, an opaque film 13 (a light-shielding layer 14, an anti-reflective layer 16), a resist underlayer coating 18, and a chemically-amplified type resist coating 20.

The transparent substrate 12 is formed of or example a quartz substrate or a soda lime glass, or the like. The light-shielding layer 14 has a chromium nitride film 22 and a chromium carbide film 24 on the transparent substrate 12 in that order. The chromium nitride film 22 is a layer mainly composed of chromium nitride (CrN), and has a film thickness of for example 15 to 20 nm. The chromium carbide film 24 is a layer mainly composed of chromium carbide (CrC), and has a film thickness of for example 50 to 60 nm.

The anti-reflective layer 16 is a film in which oxygen and nitrogen are added in chromium (CrON coating), and formed on the chromium carbide film 24. The anti-reflective layer 16 has a film thickness of for example 20 to 30 nm. The anti-reflective layer 16 may be a film mainly composed of chromium oxide (CrO).

The resist underlayer coating 18 is a layer for inhibiting deactivation of the chemically-amplified type resist coating 20, and formed on the opaque film 13 the top layer of which is the anti-reflective layer 16. The film thickness of the resist underlayer coating is for example 25 nm or less. The film thickness of the resist underlayer coating 18 may be 1 to 25 nm, and is more preferably 1 to 15 nm, most preferably 5 to 10 nm.

In this embodiment, the resist underlayer coating 18 can exert a sufficient anti-deactivation effect in an extremely thin film thickness. In addition, it can suitably improve etching rate. In addition, a chemically-amplified type resist coating 20 is formed on the resist underlayer coating 18.

In a variation of the first embodiment of mask blank 10 for which the resist underlayer coating forming composition of the present invention is applied, the mask blank 10 may be a mask blank for phase shift. In this case, the mask blank 10 has further for example a phase shift film between a transparent substrate 12 and an opaque film 13. As the phase shift film, several known halftone films such as chromium based one (CrON, etc.), molybdenum based one (MoSiON, etc.), tungsten based one (WSiON, etc.), silicon based one (SiN, etc.) can be used. The mask blank 10 for phase shift may be a phase shift film provided on an anti-reflective layer 16.

Figure 2:
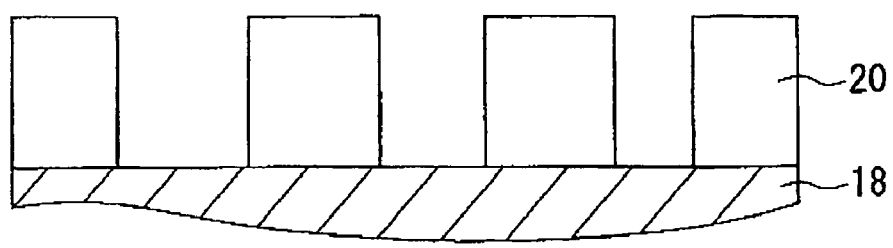
FIG. 2 is a sectional view showing the upper part of the mask blank 10 in FIG. 1 in which a chemically-amplified type resist coating 20 was patterned by electron beam lithography process.

FIG. 2 is a drawing showing a state where the chemically-amplified type resist coating 20 in the first embodiment of mask blank 10 for which the resist underlayer coating forming composition of the present invention was applied was patterned by electron beam lithography process. A photomask on which an opaque film 13 was patterned can be produced by etching a resist underlayer coating 18 and an opaque film 13 (an anti-reflective layer 16 and a light-shielding layer 14) by use of the patterned chemically-amplified type resist coating 20 as a mask. The photomask has a light-shielding pattern formed by patterning.

The condition for etching the opaque film 13 means an etching condition in the step for etching the opaque film 13 by use of the patterned chemically-amplified type resist coating 20 as a mask.

In this case, under this condition, the etching rate (etching speed) of the resist underlayer coating 18 is 1.0 time or more of that of the chemically-amplified type resist coating 20 as a mask. Therefore, according to this example, the opaque film 13 can be etched without any lowering in the resolving property of the chemically-amplified type resist coating 20. In addition, the resolving property of the patterning of the opaque film 13 can be improved. The etching rate of the resist underlayer coating is for example 1.0 time to 20 times, more preferably 1.0 to 10 times, most preferably 1.1 to 10 times of that of the chemically-amplified type resist coating 20.

EXAMPLES

Synthetic Example 1

Synthesis of Polymer Compound of Formula [5-42]

After dissolving 30.0 g of a brominated epoxy phenol novolak resin (manufactured by Nippon Kayaku Co., Ltd., trade name: BREN-304, bromine atom content: 42 mass %, with about 1.5 bromine atom per benzene ring) and 11.6 g of benzoic acid in 168.4 g of propylene glycol monomethyl ether, 0.56 g of benzyl triethyl ammonium was added, and reacted at a reflux temperature for 24 hours to obtain a solution of the polymer compound of [5-42]. GPC analysis of the obtained polymer compound showed that it had a weight average molecular weight of 2500 in terms of standard polystyrene.

Synthetic Example 2

Synthesis of Polymer Compound of Formula [5-43]

After dissolving 30.0 g of a brominated epoxy phenol novolak resin (manufactured by Nippon Kayaku Co., Ltd., trade name: BREN-304, bromine atom content: 42 mass %, with about 1.5 bromine atom per benzene ring), 6.5 g of 2-naphthalene carboxylic acid and 12.6 g of 9-anthracene carboxylic acid in 198.7 g of propylene glycol monomethyl ether, 0.56 g of benzyl triethyl ammonium was added, and reacted at a reflux temperature for 24 hours to obtain a solution of the polymer compound of [5-43]. GPC analysis of the obtained polymer compound showed that it had a weight average molecular weight of 2800 in terms of standard polystyrene.

Synthetic Example 3

Synthesis of Polymer Compound of Formula [5-44]

After dissolving 30.0 g of a brominated epoxy phenol novolak resin (manufactured by Nippon Kayaku Co., Ltd., trade name: BREN-304, bromine atom content, 42 mass %, with about 1.5 bromine atom per benzene ring) and 27.0 g of 1,6-dibromo-2-naphthol in 231.3 g of propylene glycol monomethyl ether, 0.84 g of benzyl triethyl ammonium was added, and reacted at a reflux temperature for 24 hours to obtain a solution of the polymer compound of [5-44]. GPC analysis of the obtained polymer compound showed that it had a weight average molecular weight of 2700 in terms of standard polystyrene.

Synthetic Example 4

Synthesis of Polymer Compound of Formula [5-45]

After dissolving 30.0 g of a brominated epoxy phenol novolak resin (manufactured by Nippon Kayaku Co., Ltd., trade name: BREN-304, bromine atom content: 42 mass %, with about 1.5 bromine atom per benzene ring) and 16.3 g of 2-naphthalene carboxylic acid in 187.3 g of propylene glycol monomethyl ether, 0.56 g of benzyl triethyl ammonium was added, and reacted at a reflux temperature for 24 hours to obtain a solution of the polymer compound of [5-45]. GPC analysis of the obtained polymer compound showed that it had a weight average molecular weight of 3000 in terms of standard polystyrene.

Synthetic Example 5

Synthesis of Polymer Compound of Formula [5-46]

After dissolving 30.0 g of a brominated epoxy phenol novolak resin (manufactured by Nippon Kayaku Co., Ltd., trade name: BREN-304, bromine atom content: 42 mass %, with about 1.5 bromine atom per benzene ring) and 12.3 g of 4-hydroxy benzoic acid in 171.6 g of propylene glycol monomethyl ether, 0.56 g of benzyl triethyl ammonium was added, and reacted at a reflux temperature for 24 hours to obtain a solution of the polymer compound of [5-46]. GPC analysis of the obtained polymer compound showed that it had a weight average molecular weight of 3200 in terms of standard polystyrene.

Synthetic Example 6

Synthesis of Polymer Compound of Formula [5-47]

After dissolving 30.0 g of a brominated epoxy phenol novolak resin (manufactured by Nippon Kayaku Co., Ltd., trade name: BREN-304, bromine atom content: 42 mass %, with about 1.5 bromine atom per benzene ring) and 34.8 g of 3,5-diiodo salicylic acid in 262.7 g of propylene glycol monomethyl ether, 0.84 g of benzyl triethyl ammonium was added, and reacted at a reflux temperature for 24 hours to obtain a solution of the polymer compound of [5-47]. GPC analysis of the obtained polymer compound showed that it had a weight average molecular weight of 3400 in terms of standard polystyrene.

Synthetic Example 7

Synthesis of Polymer Compound of Formula [5-48]

After dissolving 21 g of glycidyl methacrylate and 39 g of 2-hydroxypropyl methacrylate in 242 g of propylene glycol monomethyl ether, the temperature was raised to 70° C. Thereafter, while maintaining the reaction solution at 70° C., 0.6 g of azobisisobutyronitrile was added, and reacted at 70° C. for 24 hours to obtain a solution of the polymer compound. GPC analysis of the obtained polymer compound showed that it had a weight average molecular weight of 50000 in terms of standard polystyrene.

In 100 g of a solution containing 20 g of this resin, 13 g of 1,6-dibromo-2-naphthol, 0.3 g of benzyl triethyl ammonium chloride and 454 g of propylene glycol monomethyl ether were added, and reacted at 130° C. for 24 hours to obtain a solution of the polymer compound of [5-48].

Synthetic Example 8

Synthesis of Polymer Compound of Formula [5-49]

After dissolving 21 g of glycidyl methacrylate and 39 g of 2-hydroxypropyl methacrylate in 242 g of propylene glycol monomethyl ether, the temperature was raised to 70° C. Thereafter, while maintaining the reaction solution at 70° C., 0.6 g of azobisisobutyronitrile was added, and reacted at 70° C. for 24 hours to obtain a solution of the polymer compound. GPC analysis of the obtained polymer compound showed that it had a weight average molecular weight of 50000 in terms of standard polystyrene.

In 100 g of a solution containing 20 g of this resin, 17 g of 3,5-diiodo salicylic acid, 0.3 g of benzyl triethyl ammonium chloride and 469 g of propylene glycol monomethyl ether were added, and reacted at 130° C. for 24 hours to obtain a solution of the polymer compound of [5-49].

Synthetic Example 9

Synthesis of Polymer Compound of Formula [5-50]

After dissolving 5.0 g of 2-hydroxyethyl methacrylate and 25.8 g of trifluoroethyl methacrylate in 123.3 g of propylene glycol monomethyl ether, the temperature was raised to 70° C. Thereafter, while maintaining the reaction solution at 70° C., 0.3 g of azobisisobutyronitrile was added, and reacted at 70° C. for 24 hours to obtain a solution of the polymer compound of [5-50]. GPC analysis of the obtained polymer compound showed that it had a weight average molecular weight of 52000 in terms of standard polystyrene.

Synthetic Example 10

Synthesis of Polymer Compound of Formula [5-51]

After dissolving 5.0 g of 2-hydroxyethyl methacrylate and 33.4 g of trichloroethyl methacrylate in 153.7 g of propylene glycol monomethyl ether, the temperature was raised to 70° C. Thereafter, while maintaining the reaction solution at 70° C. 0.4 g of azobisisobutyronitrile was added, and reacted at 70° C. for 24 hours to obtain a solution of the polymer compound of [5-51]. GPC analysis of the obtained polymer compound showed that it had a weight average molecular weight of 47000 in terms of standard polystyrene.

Synthetic Example 11

Synthesis of Polymer Compound of Formula [5-52]

After dissolving 5.0 g of 2-hydroxyethyl methacrylate and 53.9 g of tribromoethyl methacrylate in 235.7 g of propylene glycol monomethyl ether, the temperature was raised to 70° C. Thereafter, while maintaining the reaction solution at 70° C., 0.6 g of azobisisobutyronitrile was added, and reacted at 70° C. for 24 hours to obtain a solution of the polymer compound of [5-52]. GPC analysis of the obtained polymer compound showed that it had a weight average molecular weight of 51000 in terms of standard polystyrene.

Synthetic Example 12

Synthesis of Polymer Compound of Formula [5-53]

After dissolving 30.0 g of an epoxidized phenol novolak resin and 40.4 g of 3,5-dibromo benzoic acid in 285.3 g of propylene glycol monomethyl ether, 0.91 g of benzyl triethyl ammonium was added, and reacted at a reflux temperature for 24 hours to obtain a solution of the polymer compound of [5-53]. GPC analysis of the obtained polymer compound showed that it had a weight average molecular weight of 1800 in terms of standard polystyrene.

Synthetic Example 13

Synthesis of Polymer Compound of Formula [5-54]

After dissolving 30.0 g of an epoxidized phenol novolak resin and 42.7 g of 3,5-dibromo salicylic acid in 294.5 g of propylene glycol monomethyl ether, 0.91 g of benzyl triethyl ammonium was added, and reacted at a reflux temperature for 24 hours to obtain a solution of the polymer compound of [5-54]. GPC analysis of the obtained polymer compound showed that it had a weight average molecular weight of 1900 in terms of standard polystyrene.

Synthetic Example 14

Synthesis of Polymer Compound of Formula [5-55]

After dissolving 30.0 g of an epoxidized phenol novolak resin and 37.5 g of 3,5-diiodo salicylic acid in 232.5 g of propylene glycol monomethyl ether, 0.61 g of benzyl triethyl ammonium was added, and reacted at a reflux temperature for 24 hours to obtain a solution of the polymer compound of [5-55]. GPC analysis of the obtained polymer compound showed that it had a weight average molecular weight of 2200 in terms of standard polystyrene.

Example 1

In 10 g of a propylene glycol monomethyl ether containing 2 g of the polymer compound obtained in Synthesis Example 1, 0.5 g of tetrabutoxymethyl glycol uril, 0.01 g of p-toluene sulfonic acid, 0.04 g of pyridinium p-toluene sulfonic acid and 0.004 g of MEGAFAC R-30 (surfactant, manufactured by Dainippon Ink and Chemicals, Inc.) were mixed, and dissolved in 49.8 g of propylene glycol monomethyl ether, 16.5 g of propylene glycol monomethyl ether acetate and 8.3 g of cyclohexanone to obtain a solution. Thereafter, the solution was filtered through a micro filter made of polyethylene having a pore diameter of 0.10 μm and further filtered through a micro filter made of polyethylene having a pore diameter of 0.05 μm to prepare a resist underlayer coating forming composition.

Example 2

The same procedure as that of Example 1 was carried out except that the polymer compound of Synthetic Example 2 was used instead of the polymer compound of Synthetic Example 1 to obtain a composition of Example 2.

Example 3

The same procedure as that of Example 1 was carried out except that the polymer compound of Synthetic Example 3 was used instead of the polymer compound of Synthetic Example 1 to obtain a composition of Example 3.

Example 4

The same procedure as that of Example 1 was carried out except that the polymer compound of Synthetic Example 4 was used instead of the polymer compound of Synthetic Example 1 to obtain a composition of Example 4.

Example 5

The same procedure as that of Example 1 was carried out except that the polymer compound of Synthetic Example 5 was used instead of the polymer compound of Synthetic Example 1 to obtain a composition of Example 5.

Example 6

The same procedure as that of Example 1 was carried out except that the polymer compound of Synthetic Example 6 was used instead of the polymer compound of Synthetic Example 1 to obtain a composition of Example 6.

Example 7

The same procedure as that of Example 1 was carried out except that the polymer compound of Synthetic Example 7 was used instead of the polymer compound of Synthetic Example 1 to obtain a composition of Example 7.

Example 8

The same procedure as that of Example 1 was carried out except that the polymer compound of Synthetic Example 8 was used instead of the polymer compound of Synthetic Example 1 to obtain a composition of Example 8.

Example 9

The same procedure as that of Example 1 was carried out except that the polymer compound of Synthetic Example 9 was used instead of the polymer compound of Synthetic Example 1 to obtain a composition of Example 9.

Example 10

The same procedure as that of Example 1 was carried out except that the polymer compound of Synthetic Example 10 was used instead of the polymer compound of Synthetic Example 1 to obtain a composition of Example 10.

Example 11

The same procedure as that of Example 1 was carried out except that the polymer compound of Synthetic Example 11 was used instead of the polymer compound of Synthetic Example 1 to obtain a composition of Example 11.

Example 12

The same procedure as that of Example 1 was carried out except that the polymer compound of Synthetic Example 12 was used instead of the polymer compound of Synthetic Example 1 to obtain a composition of Example 12

Example 13

The same procedure as that of Example 1 was carried out except that the polymer compound of Synthetic Example 13 was used instead of the polymer compound of Synthetic Example 1 to obtain a composition of Example 13.

Example 14

The same procedure as that of Example 1 was carried out except that the polymer compound of Synthetic Example 14 was used instead of the polymer compound of Synthetic Example 1 to obtain a composition of Example 14.

Example 15

The same procedure as that of Example 1 was carried out except that hexamethoxymethylol melamine was used instead of tetrabutoxymethyl glycol uril to obtain a composition of Example 15.

Example 16

The same procedure as that of Example 1 was carried out except that the polymer compound of Synthetic Example 2 was used instead of the polymer compound of Synthetic Example 1, and hexamethoxymethylol melamine was used instead of tetrabutoxymethyl glycol uril to obtain a composition of Example 16.

Example 17

The same procedure as that of Example 1 was carried out except that the polymer compound of Synthetic Example 3 was used instead of the polymer compound of Synthetic Example 1, and hexamethoxymethylol melamine was used instead of tetrabutoxymethyl glycol uril to obtain a composition of Example 17.

Example 18

The same procedure as that of Example 1 was carried out except that the polymer compound of Synthetic Example 4 was used instead of the polymer compound of Synthetic Example 1, and hexamethoxymethylol melamine was used instead of tetrabutoxymethyl glycol uril to obtain a composition of Example 18.

Example 19

The same procedure as that of Example 1 was carried out except that the polymer compound of Synthetic Example 5 was used instead of the polymer compound of Synthetic Example 1, and hexamethoxymethylol melamine was used instead of tetrabutoxymethyl glycol uril to obtain a composition of Example 19.

Example 20

The same procedure as that of Example 1 was carried out except that the polymer compound of Synthetic Example 6 was used instead of the polymer compound of Synthetic Example 1, and hexamethoxymethylol melamine was used instead of tetrabutoxymethyl glycol uril to obtain a composition of Example 20.

Example 21

The same procedure as that of Example 1 was carried out except that the polymer compound of Synthetic Example 7 was used instead of the polymer compound of Synthetic Example 1, and hexamethoxymethylol melamine was used instead of tetrabutoxymethyl glycol uril to obtain a composition of Example 21.

Example 22

The same procedure as that of Example 1 was carried out except that the polymer compound of Synthetic Example 8 was used instead of the polymer compound of Synthetic Example 1, and hexamethoxymethylol melamine was used instead of tetrabutoxymethyl glycol uril to obtain a composition of Example 22.

Example 23

The same procedure as that of Example 1 was carried out except that the polymer compound of Synthetic Example 9 was used instead of the polymer compound of Synthetic Example 1, and hexamethoxymethylol melamine was used instead of tetrabutoxymethyl glycol uril to obtain a composition of Example 23.

Example 24

The same procedure as that of Example 1 was carried out except that the polymer compound of Synthetic Example 10 was used instead of the polymer compound of Synthetic Example 1, and hexamethoxymethylol melamine was used instead of tetrabutoxymethyl glycol uril to obtain a composition of Example 24.

Example 25

The same procedure as that of Example 1 was carried out except that the polymer compound of Synthetic Example 11 was used instead of the polymer compound of Synthetic Example 1, and hexamethoxymethylol melamine was used instead of tetrabutoxymethyl glycol uril to obtain a composition of Example 25.

Example 26

The same procedure as that of Example 1 was carried out except that the polymer compound of Synthetic Example 12 was used instead of the polymer compound of Synthetic Example 1, and hexamethoxymethylol melamine was used instead of tetrabutoxymethyl glycol uril to obtain a composition of Example 26.

Example 27

The same procedure as that of Example 1 was carried out except that the polymer compound of Synthetic Example 13 was used instead of the polymer compound of Synthetic Example 1, and hexamethoxymethylol melamine was used instead of tetrabutoxymethyl glycol uril to obtain a composition of Example 27.

Example 28

The same procedure as that of Example 1 was carried out except that the polymer compound of Synthetic Example 14 was used instead of the polymer compound of Synthetic Example 1, and hexamethoxymethylol melamine was used instead of tetrabutoxymethyl glycol uril to obtain a composition of Example 28

(Dissolution Test in Resist Solvent)

The resist underlayer coating forming compositions prepared in Examples 1 to 28 were coated on silicon wafers by means of a spinner. The coated silicon wafers were baked at 205° C. for 1 minute on a hot plate to form resist underlayer coatings (film thickness 0.10 μm). The resist underlayer coatings were dipped in a solvent used for resists, for example ethyl lactate and propylene glycol monomethyl ether and as a result it was confirmed that the resulting resist underlayer coatings were insoluble in these solvents.

(Measurement of Dry Etching Rate)

The resist underlayer coating forming compositions prepared in Examples 1 to 28 were coated on silicon wafers by means of a spinner. The coated silicon wafers were baked at 205° C. for 1 minute on a hot plate to form resist underlayer coatings (film thickness 0.10 μm). Then, dry etching rate on the resist underlayer coatings was measured with RIE system ES401 manufactured by Nippon Scientific Co., Ltd.

Further, similarly to the above, a coating was formed on a silicon wafer from a resist solution by use of a spinner. Then, dry etching rate on the resist underlayer coatings was measured with RIE system ES401 manufactured by Nippon Scientific Co., Ltd., and compared with that of the resist underlayer coatings of Examples 1 to 28. The results are shown in Table 1.

In Table 1, the measurement of dry etching rate ratio of the coating type underlayer coating of the present invention to the resist (resist underlayer coating/resist) was carried out by using $CF_4$ gas as an etching gas.

TABLE 1

| Dry etching rate ratio (resist underlayer coating/resist) | |
| --- | --- |
| Example 1 | 1.3 |
| Example 2 | 1.3 |
| Example 3 | 1.5 |
| Example 4 | 1.3 |
| Example 5 | 1.5 |
| Example 6 | 1.7 |
| Example 7 | 1.5 |
| Example 8 | 1.7 |
| Example 9 | 2.3 |
| Example 10 | 2.7 |
| Example 11 | 3.2 |
| Example 12 | 1.3 |
| Example 13 | 1.5 |
| Example 14 | 1.5 |
| Example 15 | 1.3 |
| Example 16 | 1.3 |
| Example 17 | 1.5 |
| Example 18 | 1.3 |
| Example 19 | 1.5 |
| Example 20 | 1.7 |
| Example 21 | 1.5 |
| Example 22 | 1.7 |
| Example 23 | 2.3 |
| Example 24 | 2.7 |
| Example 25 | 3.2 |
| Example 26 | 1.3 |
| Example 27 | 1.5 |
| Example 28 | 1.5 |

Hereinafter, an example of a first embodiment of a mask blank for which the resist underlayer coating forming composition of the present invention is applied, and comparative examples are shown.

Example 29

As a transparent substrate, a synthetic quartz substrate having a size of 152.4 mm-square and 6.35 mm-thickness was used, and as an opaque film 13 on the transparent substrate, a chromium nitride film 22 and a chromium carbide film 24 were coated by spattering to form a light-shielding layer 14, and then as a anti-reflective layer 16, a coating in which oxygen and nitrogen were added in chromium (CrON film) was formed. In the meanwhile, the film thickness of the anti-reflective layer 16 was adjusted to 30 nm. The film thickness of the chromium nitride film 22 was adjusted to about 20 nm, and the film thickness of the chromium carbide film 24 was adjusted to about 60 nm.

Further, the resist underlayer coating forming composition of Example 6 was coated in a film thickness of about 10 nm by spinning coating method (spinner method) to form a resist underlayer coating 18. Then, it was heat-treated at 130° C. for 10 minutes on a hot plate, and the resist under layer coating 18 was dried. Subsequently, as a chemically-amplified type resist coating 20, a commercially available chemically-amplified type positive resist for exposure to electron beam (FEP171 manufactured by Fuji Film Arch Co., Ltd.) was coated in a thickness of about 400 nm by spinning coating method, and then heat-treated at 130° C. for 10 minutes on a hot plate, and the chemically-amplified type resist coating 20 was dried to obtain a mask blank 10 being a photomask blank with resist coating.

Comparative Example 1

The same procedure as that of Example 29 was carried out except that the resist underlayer coating 18 was not formed, to obtain a mask blank of Comparative Example 1.

Comparative Example 2

The same procedure as that of Example 29 was carded out except a known organic anti-reflective coating (BARC: Bottom Anti Reflection Coating: anti-reflective coating containing a polymer compound having no halogen atom) was used as the resist underlayer coating 18. As the BARC, a coating (trade name: NCA 3211) manufactured by Nissan Chemical Industries, Ltd. was used.

In order to compare the difference in the resolving property on the mask blanks of Example 29 and Comparative Examples 1 and 2, the opaque layer was patterned. Firstly, each mask blank was exposed to light with an electron beam exposure equipment, and then subjected to baking and development treatments after exposure to light to form a resist pattern. The exposure to light was carried out by electron beam accelerated with an accelerating voltage of 50 eV or more.

Subsequently, the resist underlayer coating 18, and the opaque film 13 (anti-reflective layer 16, and light-shielding layer 14) were patterned by dry etching by use of resist pattern as mask with $Cl_4O_2$ as an etching gas. Under this dry etching condition, the etching rate of the resist underlayer coating of Example 29 was about 10 nm/sec. On the other hand, the etching rate of the organic anti-reflective coating that was used instead of the resist underlayer coating in Comparative Example 2 was about 5 nm/sec being relatively low compared with that of Example 29.

Figure 3:
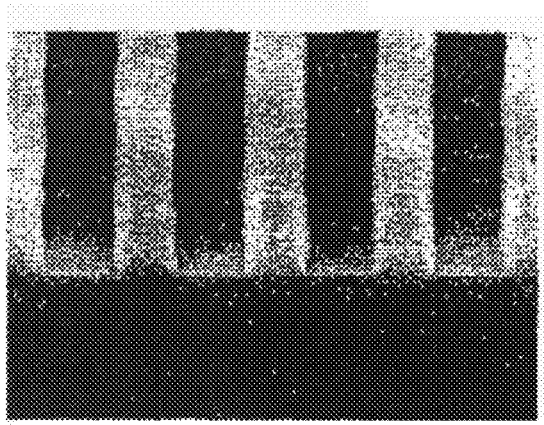
FIG. 3 is a photograph of the section of the chemically-amplified type resist coating and opaque film that were dry etched, in the mask blank 10 according to Example 29.

FIG. 3 is a photograph of the section of the mask blank 10 according to Example 29, in which the state of the chemically-amplified type resist coating and opaque film after dry etching was shown. In Example 29, it was confirmed that no projection in a bottom-extended shape was formed at the bottom of the resist pattern. In addition, it was confirmed that the opaque film 13 was patterned without occurrence of lowering in the resolving property of the resist pattern.

By use of a photomask formed by removing the chemically-amplified type resist coating 20 and the resist underlayer coating 18, the projection part (roughness of pattern edge) of the opaque film 13 (anti-reflective layer 16 and light-shielding layer 14) was observed with SEM (Scanning Electron Microscope). As a result of it, the roughness was about 10 nm or less. In addition, it was confirmed that 100 nm line and space pattern was resolved. In the meanwhile, the removal of the chemically-amplified type resist coating 20 and the resist underlayer coating 18 was carried by dipping in a resist stripper prepared by adding hydrogen peroxide water in concentrated sulfuric acid.

Figure 4:
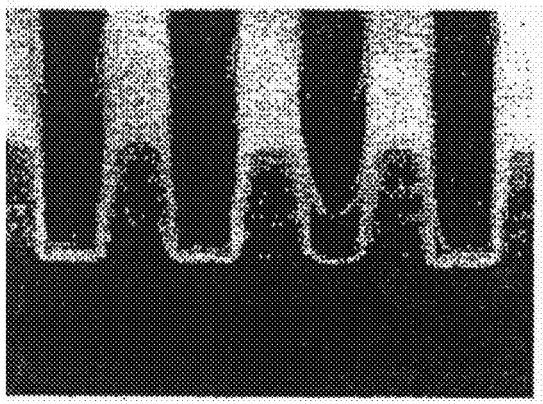
FIG. 4 is a photograph of the section of the chemically-amplified type resist coating and opaque film that were dry etched, in the mask blank according to Comparative Example 1.

FIG. 4 is a photograph of the section of the mask blank according to Comparative Example 1, in which the state of the chemically-amplified type resist coating and opaque film after dry etching was shown. In Comparative Example 1, it was confirmed that projections in a bottom-extended shape were formed at the bottom of the resist pattern. In addition, by use of a photomask formed by removing the chemically-amplified type resist coating, the projection part (roughness of pattern edge) of the opaque film (anti-reflective layer and light-shielding layer) was observed with SEM (Scanning Electron Microscope). As a result of it, the roughness was about 30 nm. In addition, only 200 nm line and space pattern was resolved.

Figure 5:
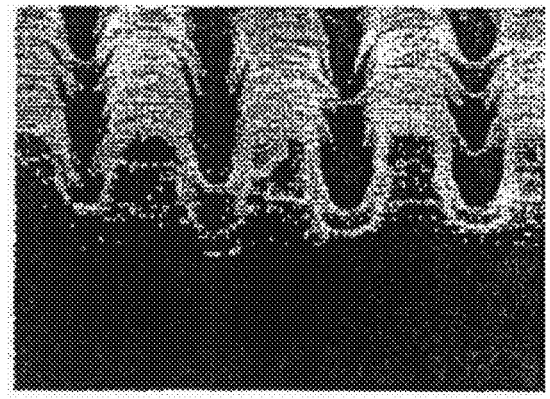
FIG. 5 is a photograph of the section of the chemically-amplified type resist coating and opaque film that were dry etched, in the mask blank according to Comparative Example 2.

FIG. 5 is a photograph of the section of the mask blank according to Comparative Example 2, in which the state of the chemically-amplified type resist coating and opaque film after dry etching was shown. In Comparative Example 2, the resolving property of the resist pattern was lowered under the influence of dry etching. Therefore, by use of a photomask formed by removing the chemically-amplified type resist coating, the projection part (roughness of pattern edge) of the opaque film (anti-reflective layer and light-shielding layer) was observed with SEM (Scanning Electron Microscope). As a result of it, the roughness was about 30 nm. In addition, only 200 nm line and space pattern was resolved.

Figure 6:
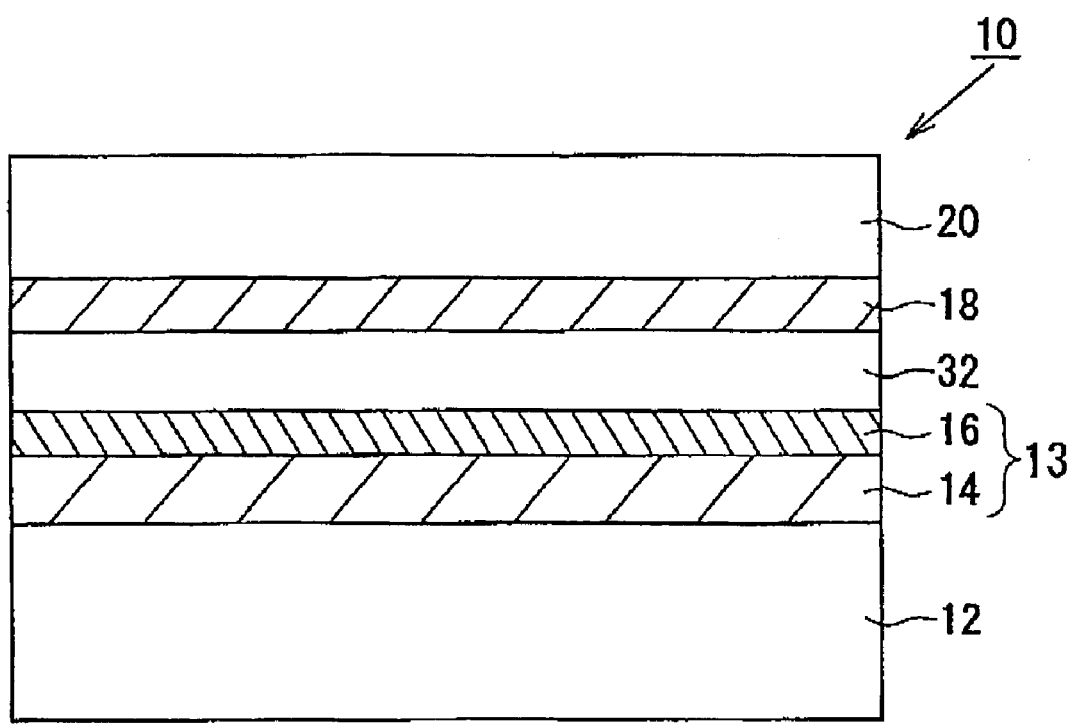
FIG. 6 is a sectional view showing a mask blank 10 according to a second embodiment for which the resist underlayer coating forming composition of the present invention is applied.

FIG. 6 is a drawing showing an example of the constitution according to a second embodiment of a mask blank 10 for which the resist underlayer coating forming composition of the present invention is applied. In the meantime, except for the following points, the structure in FIG. 6 identical with or similar to that in FIG. 1 is shown in the same reference numeral as that in FIG. 1 and the explanation thereof is omitted. In this example, a mask blank 10 is composed of a transparent substrate 12, an opaque film 13 (light-shielding layer 14, anti-reflective layer 16), a silicide film 32, a resist underlayer coating 18, and a chemically-amplified type resist coating 20.

The silicide film 32 is a silicide film for hard mask and an anti-reflective layer 16 is intervened between the light-shielding layer 14 and the silicide film 32. In the meantime, the silicide film 32 means a film made of a silicide based material. The silicide film 32 may be a film containing for example MoSi such as MoSiO, MoSiN, or MoSiON, etc. In addition, the silicide film may be a film of TaSiO, TaSiN, TaSiON, WSiO, WSiN, WSiON, ZrSiO, ZrSiN, ZrSiON, TiSiO, TiSiN, or TiSiON, etc. The resist underlayer coating 18 is an organic coating for improving the adhesion between the silicide film 32 and the chemically-amplified type resist coating 20, and formed on the silicide film 32.

The adhesion of the resist underlayer coating 18 to the silicide film 32 is higher than the adhesion of the chemically-amplified type resist coating 20 that would be formed on the silicide film 32 to the silicide film 32. The film thickness of the resist underlayer coating is for example 25 nm or less (for example 1-25 nm), more preferably 1 to 15 nm, most preferably 5 to 10 nm. On the resist underlayer coating 18, a chemically-amplified type resist coating 20 is formed.

Figure 7:
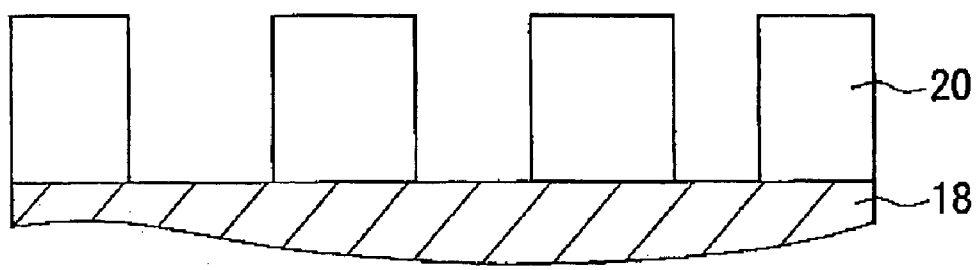
FIG. 7 is a sectional view showing the upper part of the mask blank 10 in FIG. 6 in which a chemically-amplified type resist coating 20 was patterned by electron beam lithography process.

FIG. 7 is a drawing showing the state in which the chemically-amplified type resist coating 20 in the second embodiment of the mask blank 10 for which the resist underlayer coating forming composition of the present invention was applied, was patterned by electron beam lithography method. The resist underlayer coating 18 and the silicide film 32 were etched by use of the chemically-amplified type resist coating 20 patterned as mentioned above as a mask. In addition, the opaque film 13 (anti-reflective layer 16 and light-shielding layer 14) was etched by use of the silicide film 32 as a mask (hard mask).

Consequently, the photomask on which the opaque film 13 was patterned could be produced.

The condition for etching the silicide film 32 is an etching condition in the etching step by which the silicide film 32 is etched by use of the patterned chemically-amplified type resist coating 20 as a mask.

In this case, under this etching condition, the etching rate of the resist underlayer coating 18 is 1.0 time or more of the etching rate of the chemically-amplified type resist coating 20. Therefore, according to this example, the silicide film 32 can be etched without any lowering in the resolving property of the chemically-amplified type resist coating 20. In addition, the resolving property of the patterning of the silicide film 32 can be improved. Further, the resolving property of the opaque film 13 can be increased due to the increase in the resolving property of patterning of the silicide film 32 used for a hard mask. The etching rate of the resist underlayer coating 18 is 1.0 time to 20 times, more preferably 1.0 to 10 times, most preferably 1.1 to 10 times of that of the chemically-amplified type resist coating 20.

Hereinafter, examples of a second embodiment of a mask blank for which the resist underlayer coating forming composition of the present invention is applied, and a comparative example are shown.

Example 30

A transparent substrate 12 similar to that in Example 29 was used, and an opaque film 13 was formed similarly to Example 29. Further, MoSiON coating was formed as a silicide film 32. The film thickness of the silicide film 32 was adjusted to 10 nm. Then, the resist underlayer coating forming composition of Example 6 was coated in a film thickness of about 10 nm by spinning coating method (spinner method) to form a resist underlayer coating 18. Then, it was heat-treated at 130° C. for 10 minutes on a hot plate, and the resist under layer coating 18 was dried. Subsequently, a chemically-amplified type resist coating 20 was formed similarly to Example 29 to obtain a mask blank 10 being a photomask blank with resist coating.

Comparative Example 3

The same procedure as that of Example 30 was carried out except that the resist underlayer coating 18 was not formed, to obtain a mask blank of Comparative Example 3.

In order to compare the difference in the adhesion between the chemically-amplified type resist coating and the silicide film on the mask blanks of Example 30 and Comparative Example 3, the chemically-amplified type resist coatings were patterned. Firstly, each mask blank was exposed to light with an electron beam exposure equipment, and then subjected to heating and development treatments after exposure to light to form a resist pattern. The exposure to light was carried out by electron beam accelerated with an accelerating voltage of 50 eV or more.

Figure 8:
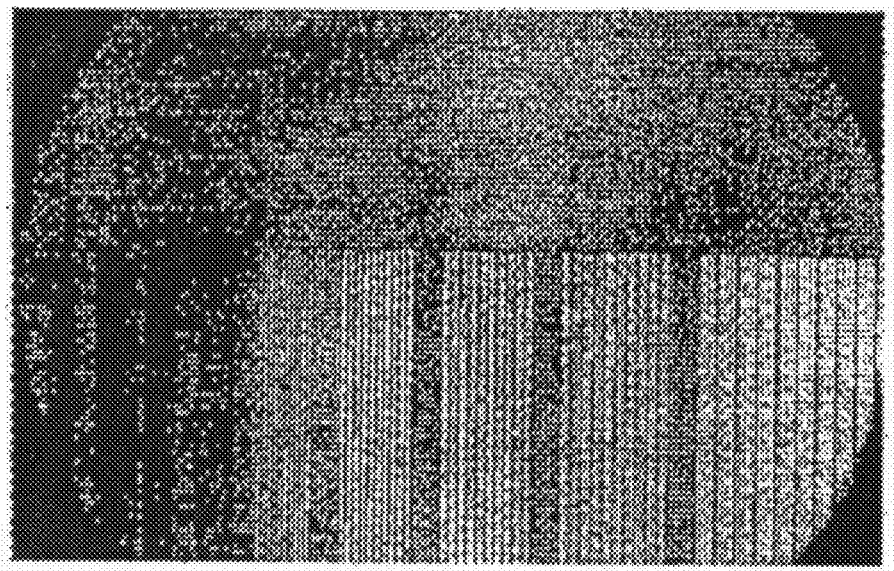
FIG. 8 is a photograph of the upper face of the mask blank 10 according to Example 30 that was subjected to development treatment.

FIG. 8 is a photograph of the upper face of the mask blank 10 according to Example 30, in which the state of the chemically-amplified type resist coating after developing treatment was shown. In Example 30, the adhesion between the chemically-amplified type resist coating 20 and the silicide 32 was improved due to the presence of the resist underlayer coating 18. Therefore, it was confirmed that a desired line and space pattern was firmly formed.

Figure 9:
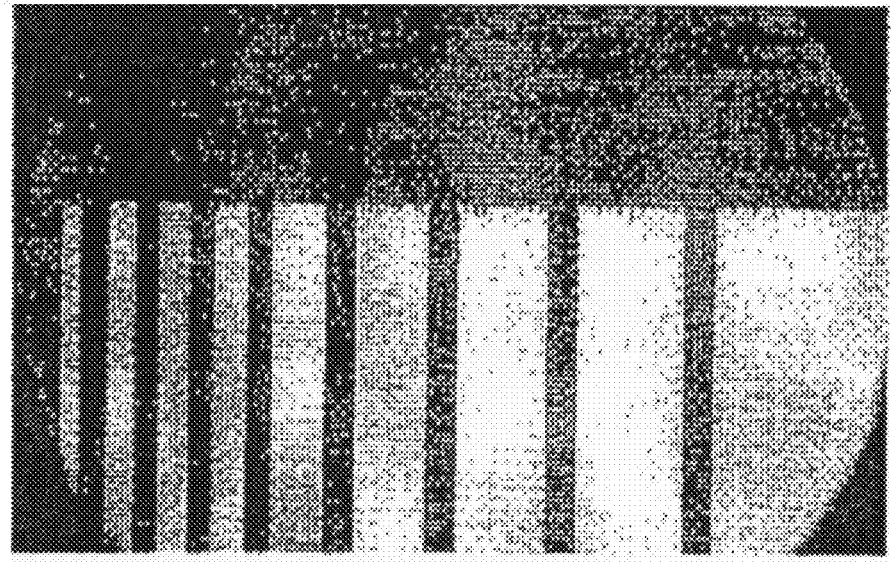
FIG. 9 is a photograph of the upper face of the mask blank 10 according to Comparative Example 3 that was subjected to development treatment.

FIG. 9 is a photograph of the upper face of the mask blank 10 according to Comparative Example 3, in which the state of the chemically-amplified type resist coating after developing treatment was shown. In Comparative Example 3, the adhesion between the chemically-amplified type resist coating and the silicide was insufficient, and disappearance of resist pattern occurred in the developing treatment.

Example 31

A mask blank and a mask were obtained similarly to Example 29 except that as a transparent substrate, a synthetic quartz substrate having a size of 152.4 mm-square and 6.35 mm-thickness was used, on the transparent substrate 12, a halftone phase shift film composed of molybdenum silicide nitride film was formed, further as an opaque film 13, a chromium nitride film 22 and a chromium carbide film 24 were coated by spattering to form a light-shielding layer 14, and then, an anti-reflective layer 16 of chromium oxide nitride was formed thereon to produce a mask blank. In the meanwhile, the halftone phase shift film was adjusted in the composition and film thickness so that the transmissivity and phase shift amount would be 5.5% and 180° in ArF excimer laser (wavelength: 193 nm), respectively. In addition, the film thickness of the opaque film 13 was adjusted so that the optical concentration would become 3.0 or more in a combination of the halftone phase shift film and the opaque film 13, and adjusted to 59 nm.

Consequently, 80 nm line and space pattern was resolved, and also as to the roughness of the pattern, further good results were obtained compared with those in Example 29.

In this specification, the mask blanks for which the resist underlayer coating forming composition of the present invention is applied have been described based on the embodiments thereof, but the technical scope of the present invention is not limited to these embodiments. Various alternation or modification can be added thereto.

INDUSTRIAL APPLICABILITY

The present invention provides resist underlayer coating forming compositions for forming underlayer coatings that are applied for mask blanks and mask resists, mask blanks in which the resist underlayer coatings composed of the resist underlayer coating forming composition are formed, and masks produced by use of the mask blanks.

What is claimed is:

1. A resist underlayer coating forming composition used for a mask blank in which a thin film for forming transfer pattern, a resist underlayer coating and a chemically-amplified type resist coating that is resist-depicted (exposed to light) by use of an electron beam accelerated with an accelerating voltage of 50 keV or more are formed on a substrate in that order, comprising a polymer compound having a halogen atom-containing repeating structural unit, and a solvent, in which the polymer compound is a compound having a halogen atom-containing repeating structural unit of formula (d), (e) or (f):

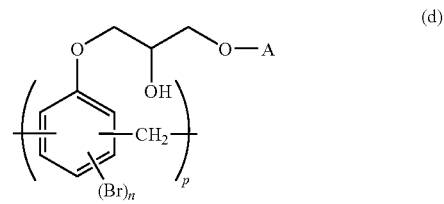

wherein A is a phenyl group, a naphthyl group, an anthranyl group, benzoyl group, naphthyl carbonyl group or anthranyl carbonyl group (the phenyl group, naphthyl group, anthranyl group, benzoyl group, naphthyl carbonyl group and anthranyl carbonyl group may be arbitrarily substituted with a hydroxy group, a halogen atom or both of a hydroxy group and a halogen atom), p is an integer of 1 to 3000, n is an integer of 0 to 3, and the compound contains at least one halogen atom in the repeating units;

(e)

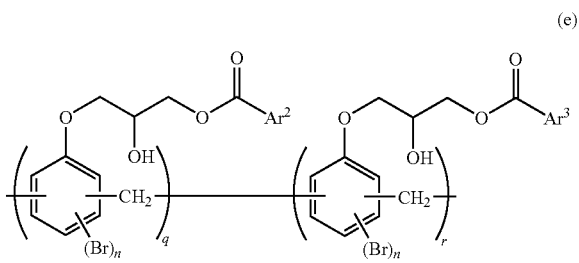

wherein $Ar^2$ and $Ar^3$ are not identical, are a phenyl group, a naphthyl group or an anthranyl group (the phenyl group, naphthyl group and anthranyl group may be arbitrarily substituted with a hydroxy group, a halogen atom or both of a hydroxy group and a halogen atom), q and r independently of each other are an integer of 1 or more and q+r are an integer of 2 to 3000, n is an integer of 0 to 3, and the compound contains at least one halogen atom in the repeating unit containing the substituent $Ar^2$, in the repeating unit containing the substituent $Ar^3$, or in both the repeating unit containing the substituent $Ar^2$ and the repeating unit containing the substituent $Ar^3$; or (f)

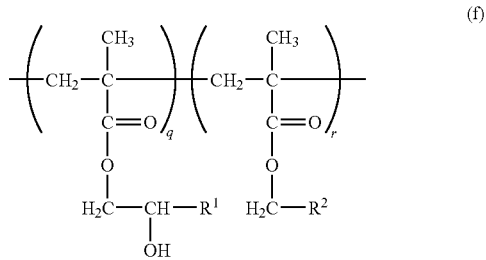

wherein $R^1$ is hydrogen atom or $C_{1-4}$alkyl group, $R^2$ is $CF_3$, $CCl_3$, $CBr_3$, $CH(OH)CH_2OR^3$ wherein $R^3$ is a phenyl group, a naphthyl group or an anthranyl group (the phenyl group, naphthyl group and anthranyl group may be arbitrarily substituted with a hydroxy group, a halogen atom or both of hydroxy group and a halogen atom), or $CH(OH)CH_2OC(O)R_4$ wherein $R^4$ is phenyl group, naphthyl group or anthranyl group (the phenyl group, naphthyl group and anthranyl group may be arbitrarily substituted with a hydroxy group, a halogen atom or both of a hydroxy group and a halogen atom), g and r independently of each other are an integer of 1 or more and q+r are an integer of 2 to 3000, and the compound contains at least one halogen atom in the repeating unit containing the substituent $R^2$, and a resist underlayer coating formed from the resist underlayer coating forming composition having a film thickness of 5 to 25 nm, and the resist underlayer coating has an etching rate of 1.1 to 10 times of the chemically-amplified type resist coating.

2. The resist underlayer coating forming composition according to claim 1, wherein the halogen atom is chlorine atom, bromine atom, or iodine atom.

3. The resist underlayer coating forming composition according to claim 1, further comprising a crosslinking agent and a crosslink catalyst, in addition to the polymer compound and the solvent.

4. The resist underlayer coating forming composition according to claim 1, further comprising an acid generator, in addition to the polymer compound and the solvent.

5. The resist underlayer coating forming composition according to claim 1, wherein the polymer compound has a weight average molecular weight of 700 to 1000000.

6. A mask blank in which a thin film for forming transfer pattern and a resist underlayer coating are formed on a substrate in that order, characterized in that the resist underlayer coating is a resist underlayer coating formed from the resist underlayer coating forming composition according to claim 1.

7. The mask blank according to claim 6, wherein the thin film for forming transfer pattern is composed of a material containing chromium.

8. The mask blank according to claim 6, wherein the mask blank is a mask blank for dry etching treatment that is applied for a mask production process comprising patterning the thin film for forming transfer pattern by dry etching treatment of a chlorine based gas containing chlorine by use of a resist pattern by a chemically-amplified type resist formed on the resist underlayer coating as a mask.

9. The mask blank according to claim 6, wherein a chemically-amplified type resist coating is formed on the resist underlayer coating.

10. A mask characterized by including a mask pattern formed by patterning the thin film for forming transfer pattern in the mask blank according to claim 6.

11. The mask blank according to claim 6, wherein the resist underlayer coating formed from the resist underlayer coating formed composition has a film thickness of 5 to 25 nm, and the resist underlayer coating has an etching rate of 1.1 to 10 times of the chemically-amplified type resist coating.

* * * * *